(12) United States Patent
More

(10) Patent No.: US 11,854,904 B2
(45) Date of Patent: Dec. 26, 2023

(54) DIFFERENT SOURCE/DRAIN PROFILES FOR N-TYPE FINFETS AND P-TYPE FINFETS

(71) Applicant: Taiwan Semiconductor Manufacturing Co., Ltd., Hsinchu (TW)

(72) Inventor: Shahaji B. More, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 8 days.

(21) Appl. No.: 17/124,047

(22) Filed: Dec. 16, 2020

(65) Prior Publication Data

US 2022/0051947 A1 Feb. 17, 2022

Related U.S. Application Data

(60) Provisional application No. 63/078,963, filed on Sep. 16, 2020, provisional application No. 63/065,259, filed on Aug. 13, 2020.

(51) Int. Cl.
*H01L 21/8238* (2006.01)
*H01L 27/092* (2006.01)
(Continued)

(52) U.S. Cl.
CPC .. *H01L 21/823814* (2013.01); *H01L 21/0262* (2013.01); *H01L 21/02532* (2013.01);
(Continued)

(58) Field of Classification Search
CPC ........... H01L 29/66795; H01L 29/0847; H01L 21/823418; H01L 29/6656
See application file for complete search history.

(56) References Cited

U.S. PATENT DOCUMENTS 10,297,601 B2   5/2019   Kim et al.
11,302,779 B2   4/2022   Choi et al.
(Continued)

FOREIGN PATENT DOCUMENTS

JP      2006024809 A  *  1/2006
KR      20160141034 A     12/2016
(Continued)

OTHER PUBLICATIONS

Machine translation of JP 2006024809 A (Year: 2006).*

*Primary Examiner* — Brian Turner
(74) *Attorney, Agent, or Firm* — Slater Matsil, LLP

(57) ABSTRACT

A method includes etching a first and a second semiconductor fin to form a first and a second recesses, epitaxially growing an n-type source/drain region comprising a first portion and a second portion from the first and the second recesses, and a first middle portion in between and having a concave top surface. A first contact opening is formed extending into the n-type source/drain region and having a first V-shaped bottom. The method further includes etching a third and a fourth semiconductor fin to form a third and a fourth recesses, and forming a p-type source/drain region including a third portion and a third portion grown from the third and the fourth recesses, and a second middle portion in between and having a convex top surface. A second contact opening is formed and has a second V-shaped bottom, with a tip of the second V-shaped bottom being downwardly pointing.

20 Claims, 20 Drawing Sheets

(51) Int. Cl.
  *H01L 29/08* (2006.01)
  *H01L 29/161* (2006.01)
  *H01L 29/45* (2006.01)
  *H01L 21/02* (2006.01)
  *H01L 21/285* (2006.01)
  *H01L 29/66* (2006.01)

(52) U.S. Cl.
  CPC .......... *H01L 21/28518* (2013.01); *H01L 21/823821* (2013.01); *H01L 21/823871* (2013.01); *H01L 27/0924* (2013.01); *H01L 29/0847* (2013.01); *H01L 29/161* (2013.01); *H01L 29/45* (2013.01); *H01L 29/66636* (2013.01)

(56) References Cited

U.S. PATENT DOCUMENTS

| | | | |
|---|---|---|---|
| 11,728,434 | B2 | 8/2023 | Kim et al. |
| 2009/0008726 | A1* | 1/2009 | Yamauchi ....... H01L 21/823842 257/E47.001 |
| 2013/0119421 | A1* | 5/2013 | Lin .................. H01L 33/22 257/E33.001 |
| 2015/0187755 | A1* | 7/2015 | Mehrotra ......... H01L 29/66628 257/192 |
| 2016/0027918 | A1* | 1/2016 | Kim .................. H01L 29/7848 257/401 |
| 2016/0190250 | A1* | 6/2016 | Kwok ............ H01L 29/66636 257/77 |
| 2016/0351570 | A1* | 12/2016 | Park ................. H01L 21/3081 |
| 2017/0194495 | A1* | 7/2017 | Li ................... H01L 29/66477 |
| 2018/0047810 | A1* | 2/2018 | Hsu ................. H01L 29/42368 |
| 2018/0166532 | A1* | 6/2018 | Hsu ................. H01L 21/28518 |
| 2018/0174913 | A1* | 6/2018 | More ............. H01L 21/823431 |
| 2018/0286861 | A1* | 10/2018 | Choi ............... H01L 21/76831 |
| 2019/0109004 | A1* | 4/2019 | Huang ............. H01L 21/0262 |
| 2019/0131434 | A1* | 5/2019 | Lee ................. H01L 29/66636 |
| 2019/0148528 | A1* | 5/2019 | Yu ................... H01L 21/02636 257/288 |
| 2019/0221663 | A1* | 7/2019 | Kim ................. H01L 29/0847 |
| 2019/0229197 | A1* | 7/2019 | Li .................... H01L 27/1104 |
| 2019/0244963 | A1* | 8/2019 | Kim .................. H01L 29/161 |
| 2019/0318970 | A1* | 10/2019 | Lee ................. H01L 29/6656 |
| 2020/0020773 | A1* | 1/2020 | Choi ................ H01L 29/785 |
| 2021/0408275 | A1* | 12/2021 | Bomberger ........ H01L 29/785 |

FOREIGN PATENT DOCUMENTS

| | | |
|---|---|---|
| KR | 20170059234 A | 5/2017 |
| KR | 20190023882 A | 3/2019 |
| KR | 20200008306 A | 1/2020 |

* cited by examiner

DIFFERENT SOURCE/DRAIN PROFILES FOR N-TYPE FINFETS AND P-TYPE FINFETS

PRIORITY CLAIM AND CROSS-REFERENCE

This application claims the benefit of the U.S. Provisional Application No. 63/065,259, filed Aug. 13, 2020, and entitled "EPI Merge and Raise height Profiles for Device," and Application No. 63/078,963, filed Sep. 16, 2020, and entitled "Merge and Raised height Profiles for Epitaxy Regions," which applications are hereby incorporated herein by reference.

BACKGROUND

In the formation of Fin Field-Effect Transistors, source/drain regions were typically formed by forming semiconductor fins, recessing semiconductor fins to form recesses, and growing epitaxy regions starting from the recesses. The epitaxy regions grown from the recesses of neighboring semiconductor fins may merge with each other, and the resulting epitaxy regions may have planar top surfaces. Source/drain contact plugs are formed to electrically connect to the source/drain regions.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
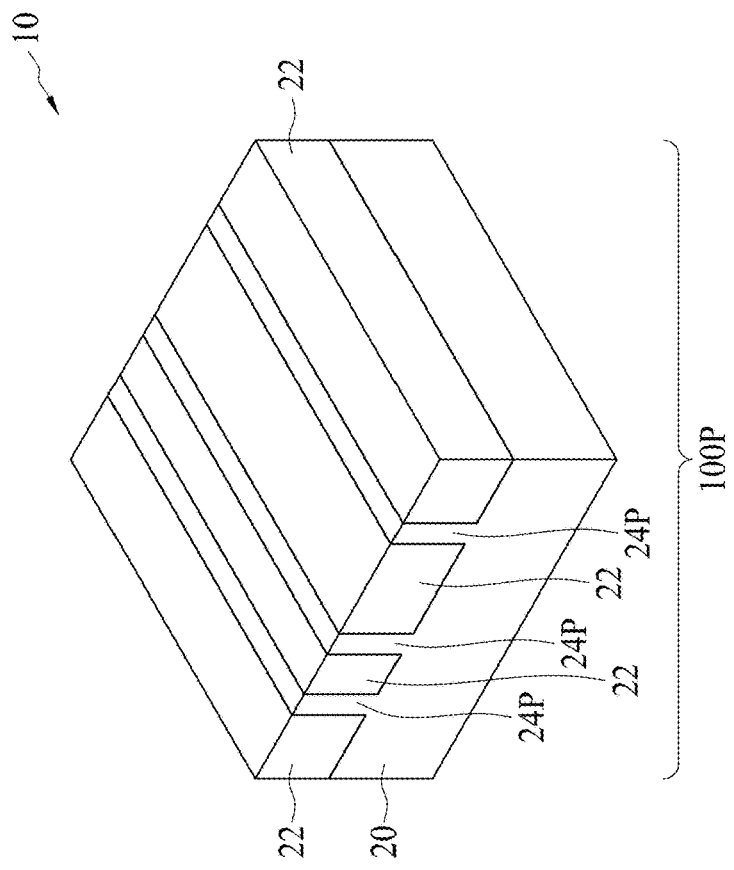
FIGS. 1, 2, 3A, 3B, 3C, 4A, 4B, 4C, 5, 6, 7A, 7B, 8A, 8B, 9, 10, 11A, 11B, and 11C illustrate the perspective views and cross-sectional views of intermediate stages in the formation of an n-type Fin Field-Effect Transistor (FinFET) and a p-type FinFET in accordance with some embodiments.
Figure 1:
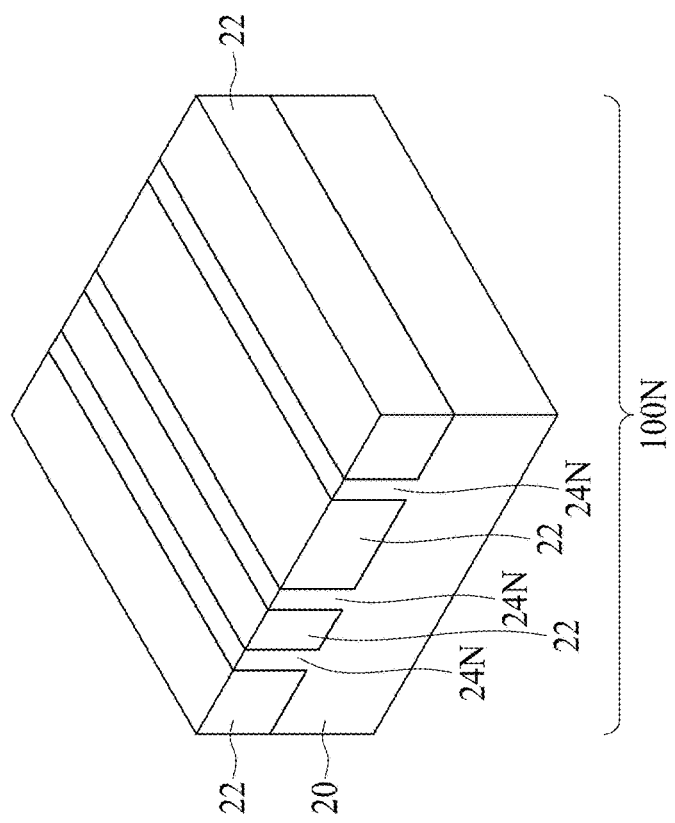

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An n-type Fin Field-Effect Transistor (FinFET), a p-type FinFET, and the method of forming the same are provided. In accordance with some embodiments of the present disclosure, the n-type source/drain regions of the n-type FinFET are deposited as having a wavy-shaped top surface, while the p-type source/drain regions of the p-type FinFET are deposited as having a cone shape. This may reduce the fin bending of the semiconductor fins in p-type FinFETs, while the contact areas of contact plugs to both of the n-type source/drain regions and the p-type source/drain regions are reduced. The silicide regions formed on both of the n-type source/drain regions and the p-type source/drain regions may have recessed middle portions (with V-shapes). Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

FIGS. 1, 2, 3A, 3B, 3C, 4A, 4B, 4C, 5, 6, 7A, 7B, 8A, 8B, 9, 10, 11A, 11B, and 11C illustrate the perspective views and cross-sectional views of intermediate stages in the formation of the n-type FinFET and the p-type FinFET in accordance with some embodiments of the present disclosure. The corresponding processes are also reflected schematically in the process flow shown in FIG. 12.

FIG. 1 illustrates a perspective view of an initial structure. The initial structure includes wafer 10, which further includes substrate 20. Substrate 20 may be a semiconductor substrate, which may be a silicon substrate, a silicon germanium substrate, or a substrate formed of other semiconductor materials. The top surface of substrate 20 may have a (100) surface plane. Substrate 20 may be doped with a p-type or an n-type impurity. Isolation regions 22 such as Shallow Trench Isolation (STI) regions may be formed to extend from a top surface of substrate 20 into substrate 20. The portions of substrate 20 between neighboring STI regions 22 are referred to as semiconductor strips 24. The top surfaces of semiconductor strips 24 and the top surfaces of STI regions 22 may be substantially level with each other in accordance with some embodiments.

STI regions 22 may include a liner oxide (not shown), which may be a thermal oxide formed through a thermal oxidation of a surface layer of substrate 20. The liner oxide may also be a deposited silicon oxide layer formed using, for example, Atomic Layer Deposition (ALD), High-Density Plasma Chemical Vapor Deposition (HDPCVD), or Chemical Vapor Deposition (CVD). STI regions 22 may also include a dielectric material over the liner oxide, wherein the dielectric material may be formed using Flowable Chemical Vapor Deposition (FCVD), spin-on, or the like.

Wafer 100 includes n-type device region 100N for forming an n-type FinFET, and p-type device region 100P for forming a p-type FinFET. To distinguish the features in n-type device region 100N and p-type device region 100P from each other, the features formed in n-type device region 100N may be referred to with a reference number followed by letter "N," and the features formed in p-type device region 100P may be referred to with a reference number followed by letter "P." For example, the semiconductor strips 24 in n-type device region 100N may be referred to as 24N, and the semiconductor strips 24 in p-type device region 100P may be referred to as 24P. In accordance with some embodiments, semiconductor strips 24N are formed of or comprise silicon (without germanium), while semiconductor strips 24P are replaced with silicon germanium. In accordance with alternative embodiments, both of semiconductor strips 24N and 24P are formed of or comprise silicon without germanium.

Figure 2:
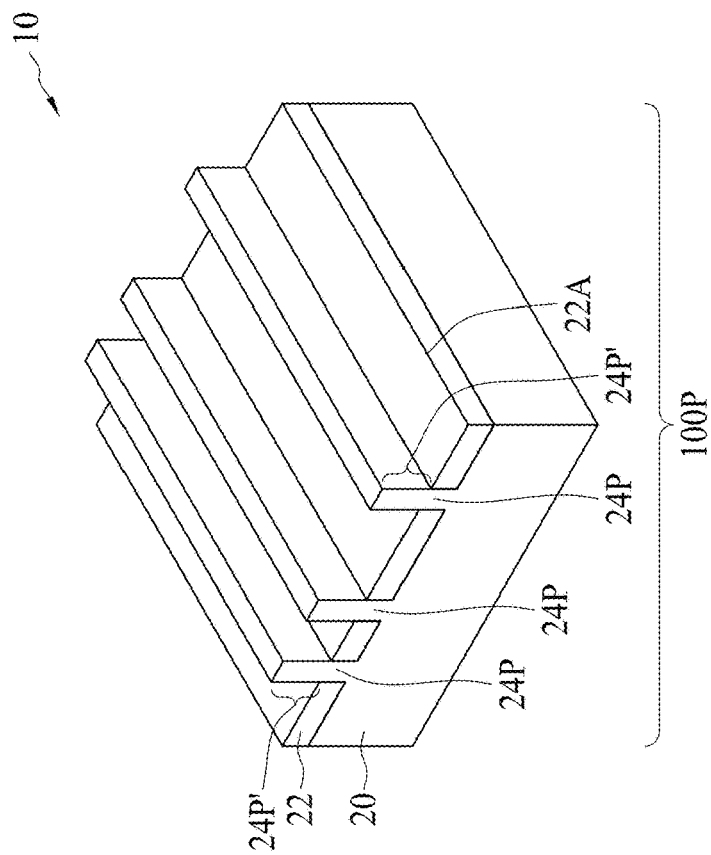
Figure 2:
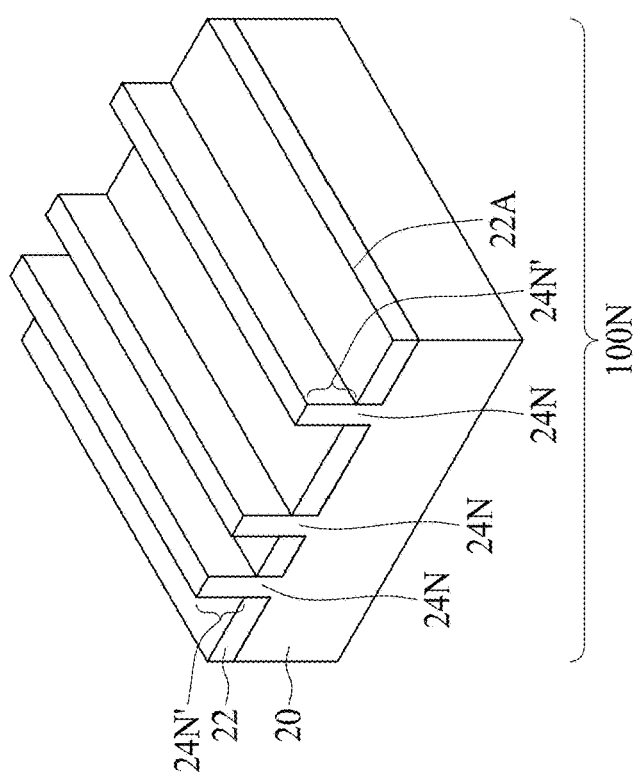

Referring to FIG. 2, STI regions 22 are recessed, so that the top portions of semiconductor strips 24N and 24P protrude higher than the top surfaces 22A of STI regions 22 to form protruding fins 24N' and 24P'. The respective process is illustrated as process 202 in the process flow shown in FIG. 12. The portions of semiconductor strips 24N and 24P in STI regions 22 are still referred to as semiconductor strips. The etching may be performed using a dry etching process, wherein a mixture of HF and $NH_3$ may be used as the etching gases. The etching may also be performed using a mixture of $NF_3$ and $NH_3$ as the etching gases. During the etching process, plasma may be generated. Argon may also be included. In accordance with alternative embodiments of the present disclosure, the recessing of STI regions 22 is performed using a wet etching process. The etching chemical may include HF solution, for example.

In accordance with some embodiments, the fins for forming the FinFETs may be formed/patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

Figure 3A:
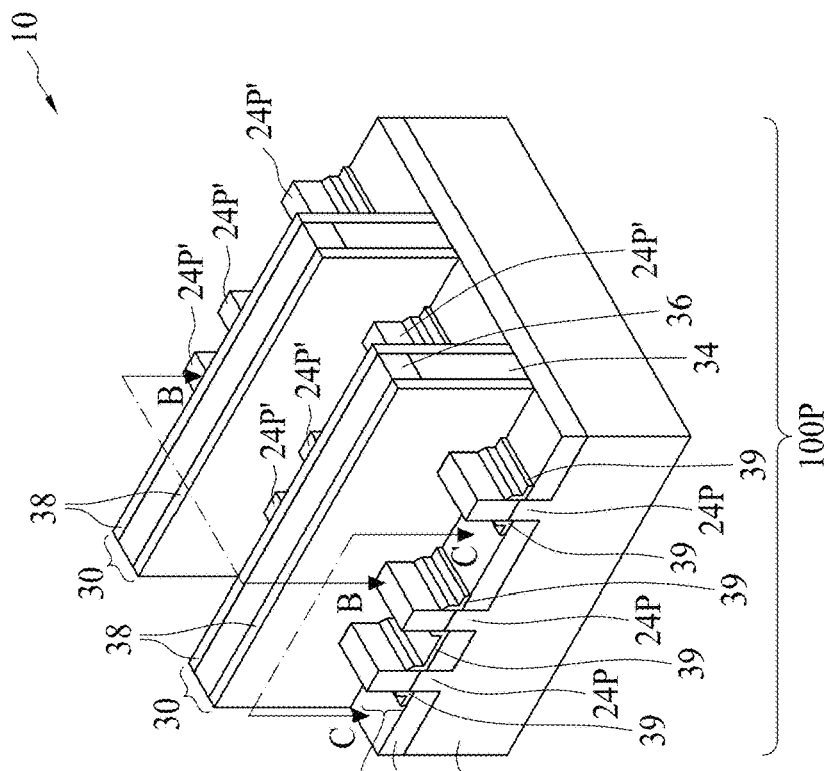
Figure 3A:
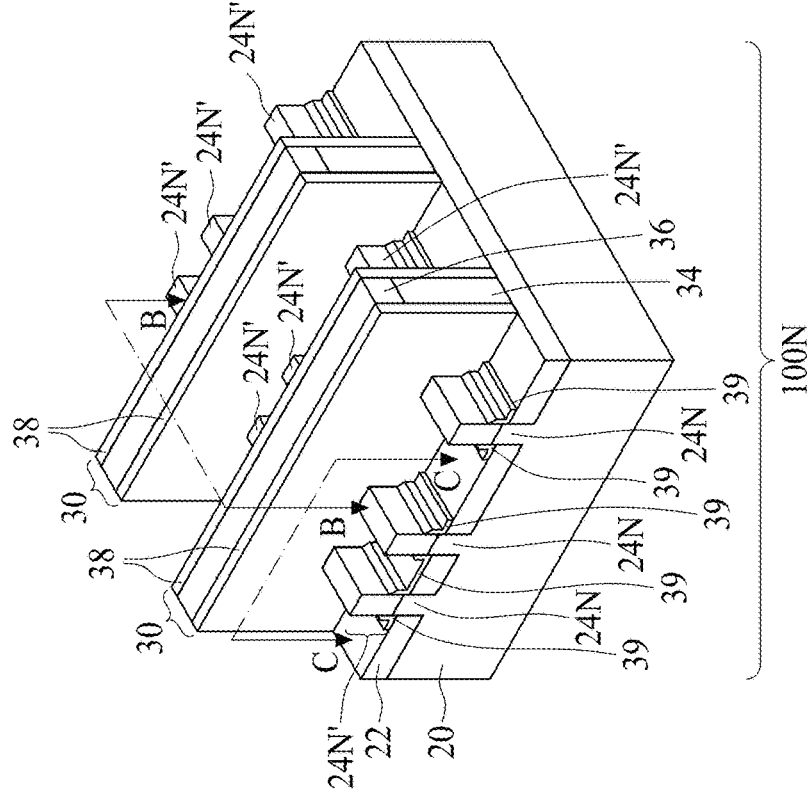
Figure 3B:
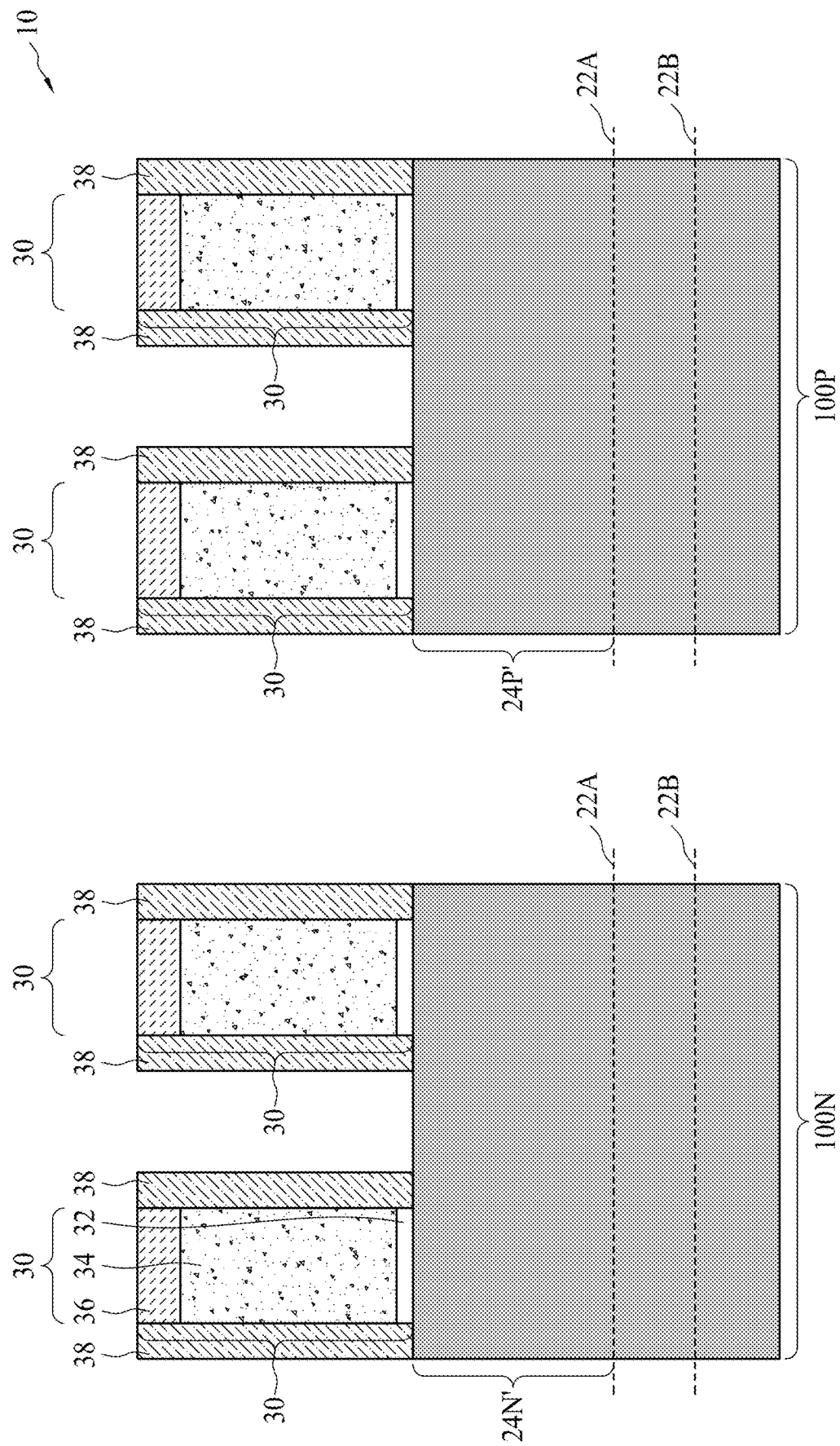
Figure 3C:
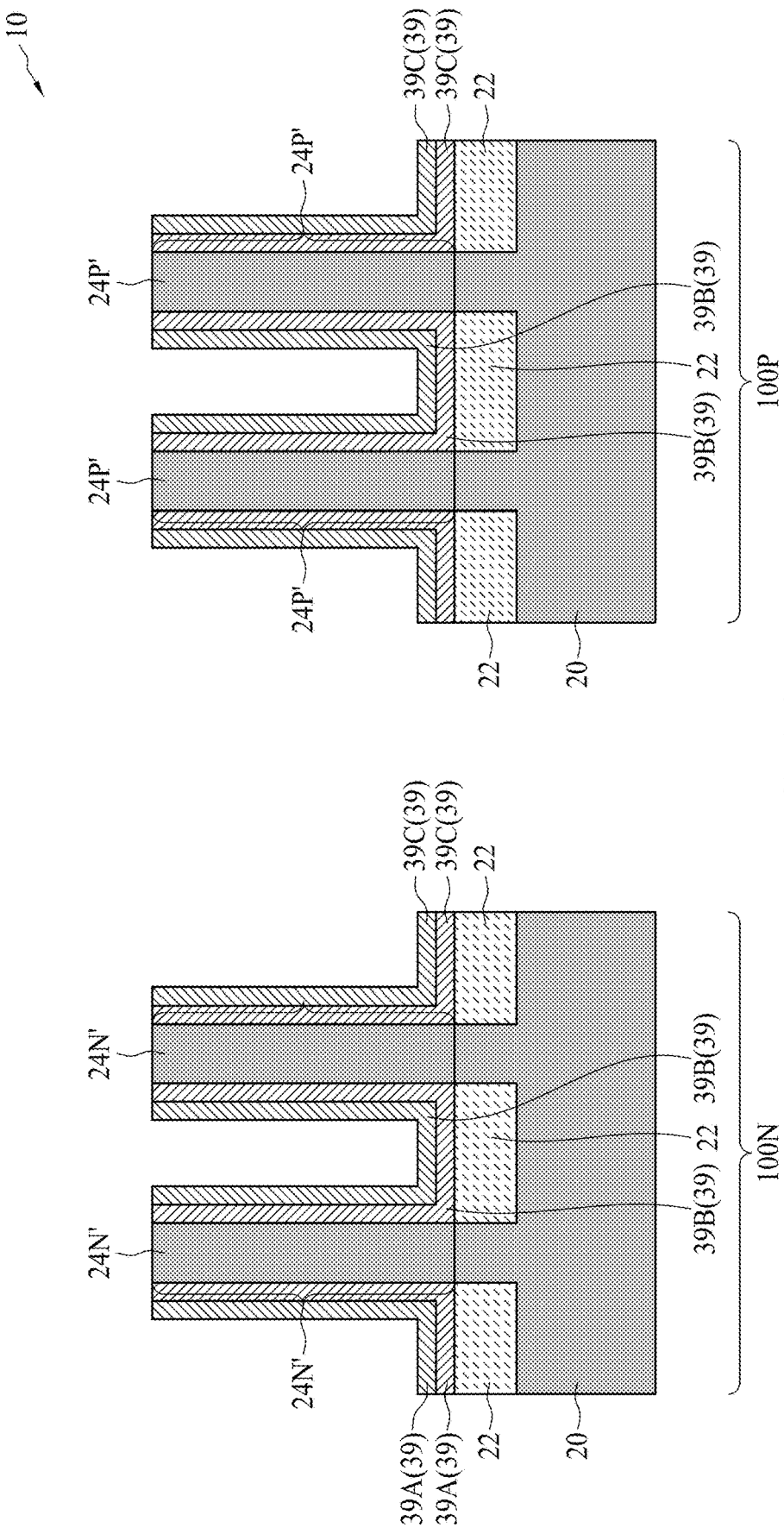

Referring to FIGS. 3A, 3B, and 3C, dummy gate stacks 30 are formed on the top surfaces and the sidewalls of protruding fins 24N' and 24P'. The respective process is illustrated as process 204 in the process flow shown in FIG. 12. In accordance with some embodiments, a fin-group for forming a FinFET may include a plurality of fins tightly grouped together. For example, the example shown in FIG. 3A illustrates a 2-fin-group on the left, and a single fin (or a multi-fin fin-group) on the right. The fins in the same fin-group may have spacings (referred to as inner-group spacing) smaller than the inter-group spacings between neighboring fin-groups.

The cross-sectional view shown in FIG. 3B is obtained from the reference cross-section B-B in FIG. 3A, and the cross-sectional view shown in FIG. 3C is obtained from the reference cross-section C-C in FIG. 3A. Dummy gate stacks 30 may include dummy gate dielectrics 32 (FIG. 3B) and dummy gate electrodes 34 over dummy gate dielectrics 32. Dummy gate electrodes 34 may be formed using, for example, amorphous silicon or polysilicon, and other materials may also be used. Each of dummy gate stacks 30 may also include one (or a plurality of) hard mask layer 36 over dummy gate electrode 34. Hard mask layers 36 may be formed of silicon nitride, silicon carbo-nitride, or the like. Dummy gate stacks 30 also have lengthwise directions perpendicular to the lengthwise directions of protruding fins 24'.

Next, gate spacers 38 (FIGS. 3A and 3B) are formed on the sidewalls of dummy gate stacks 30. The respective process is illustrated as process 206 in the process flow shown in FIG. 12. In accordance with some embodiments of the present disclosure, gate spacers 38 are formed of dielectric materials such as silicon carbon-oxynitride (SiCN), silicon nitride, silicon oxy-carbon-oxynitride (SiOCN), or the like, and may have a single-layer structure or a multi-layer structure including a plurality of dielectric layers.

In accordance with some embodiments of the present disclosure, gate spacers 38 are multi-layer gate spacers. For example, each of gate spacers 38 may include a SiN layer, and a SiOCN layer over the SiN layer. FIGS. 3A and 3C also illustrate fin spacers 39 formed on the sidewalls of protruding fins 24'. The respective process is also illustrated as process 206 in the process flow shown in FIG. 12. In accordance with some embodiments of the present disclosure, fin spacers 39 are formed by the same processes for forming gate spacers 38. For example, in the process for forming gate spacers 38, the blanket dielectric layer(s) that are deposited for forming gate spacers 38, when etched, may have some portions left on the sidewalls of protruding fins 24'N and 24P', hence forming fin spacers 39. In accordance with some embodiments, the fin spacers 39 include outer fin spacers such as fin spacers 39A and 39C (FIG. 3C), which are on the outer side of the outmost fin in the fin-group. The fin spacers 39 further include inner fin spacers such as fin spacer 39B, with the inner fin spacer being between the fins 24'N and 24P' in the same fin-group.

Figure 4A:
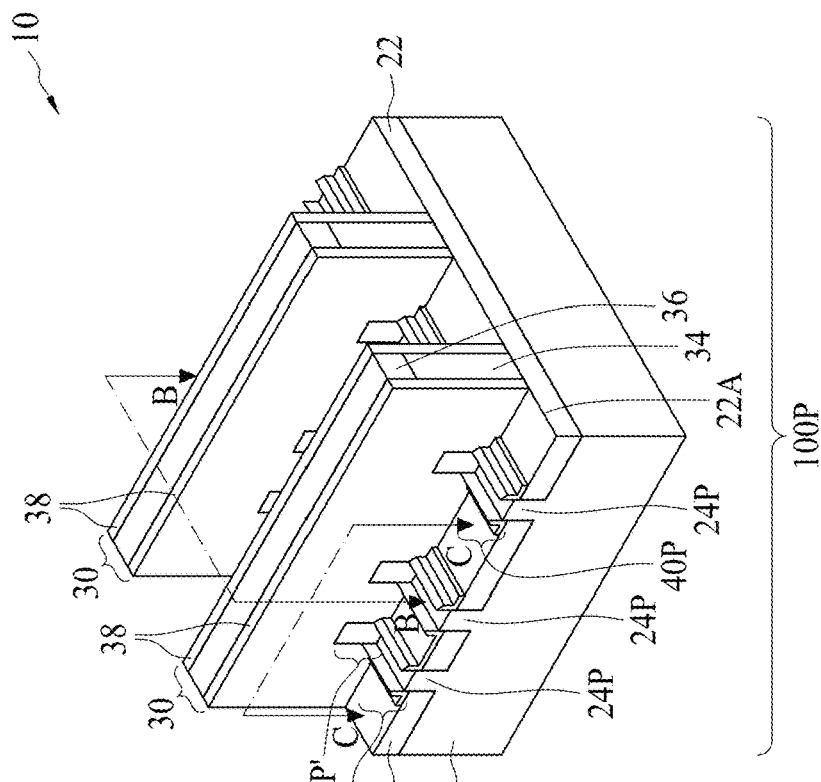
Figure 4A:
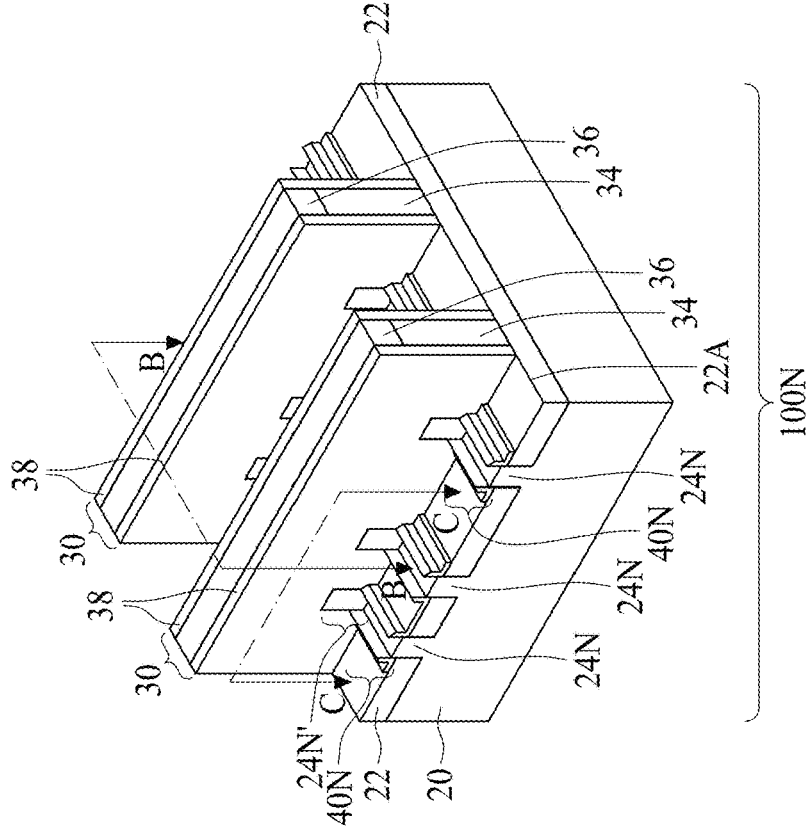
Figure 4B:
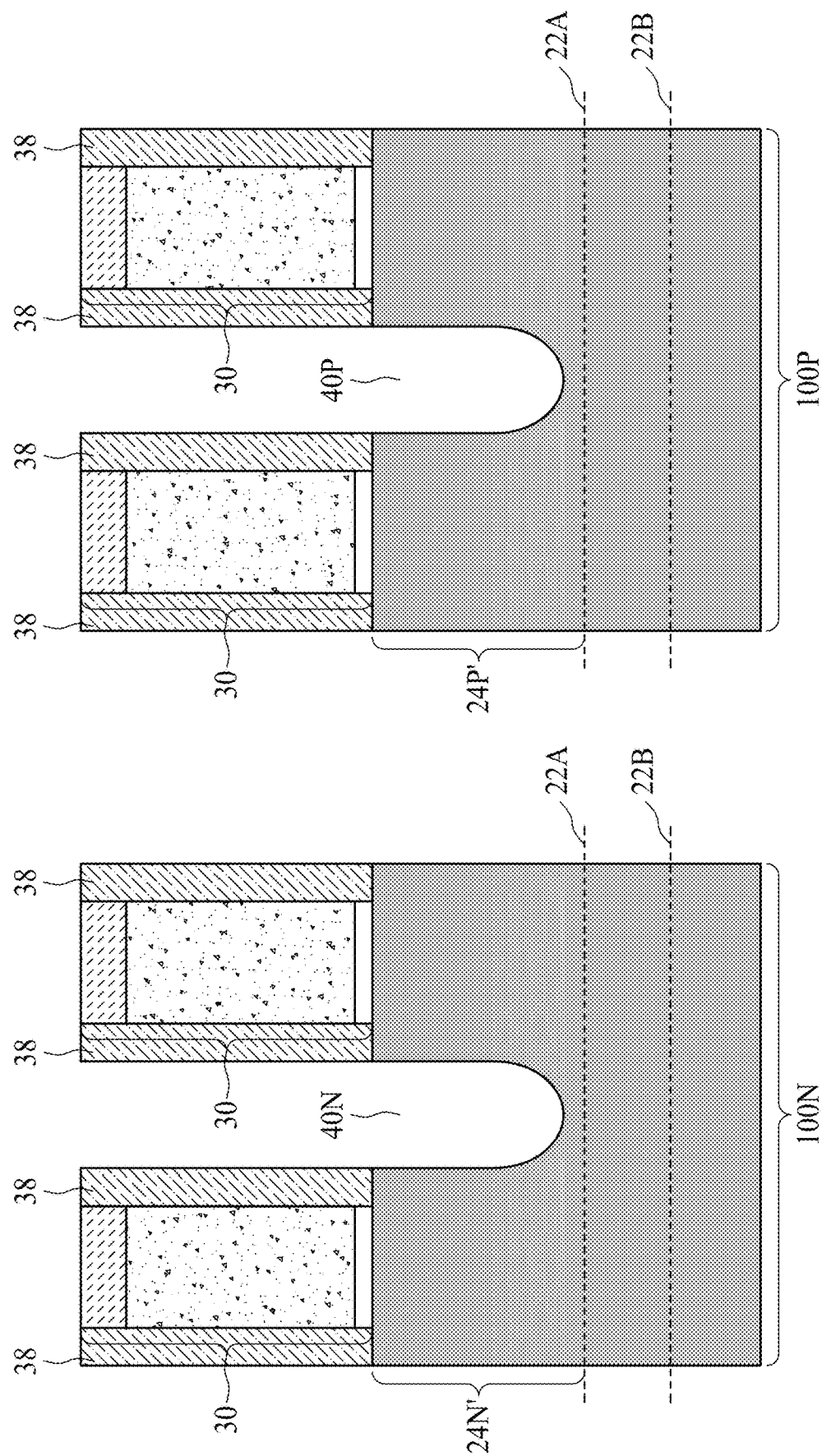
Figure 11A:
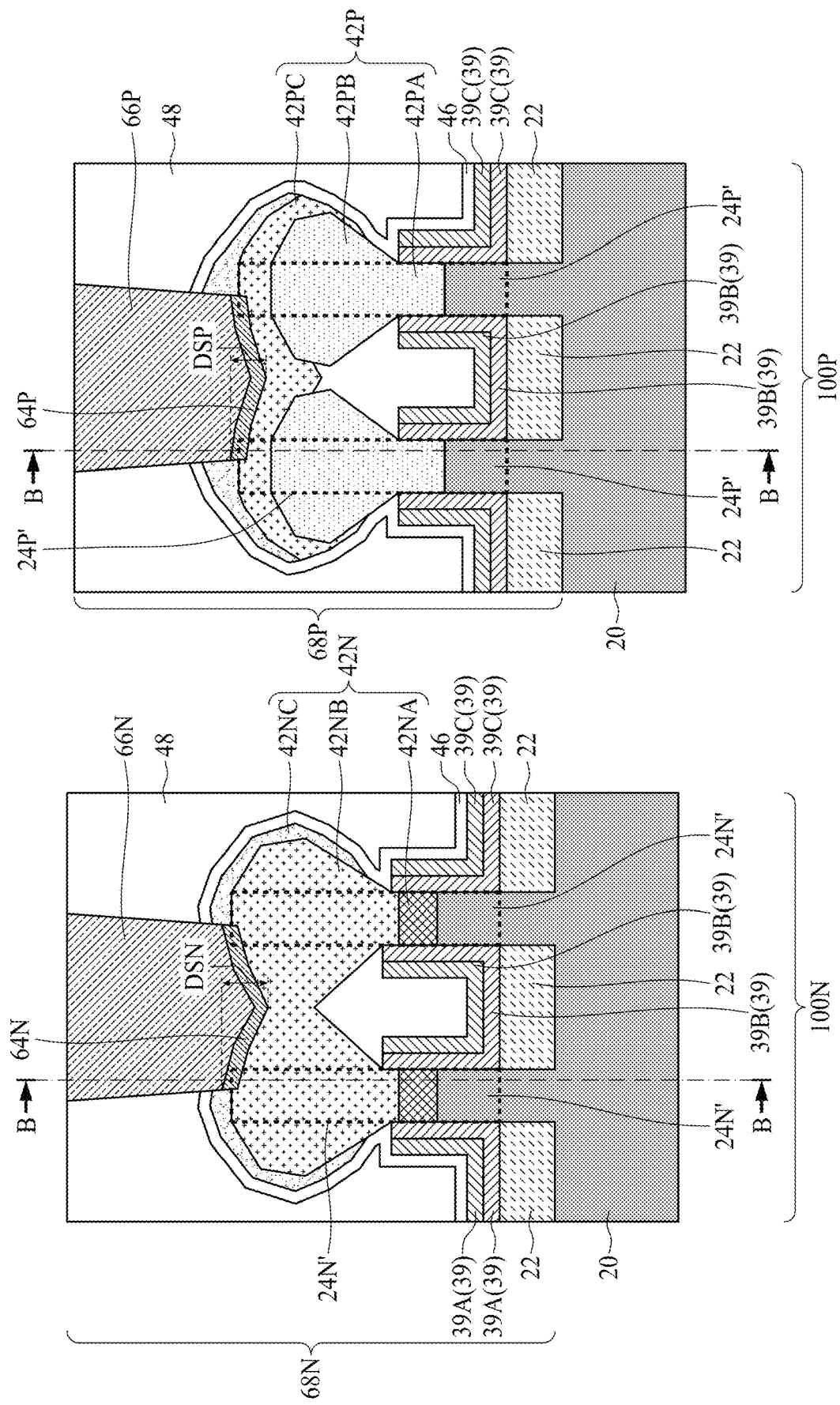
Figure 11B:
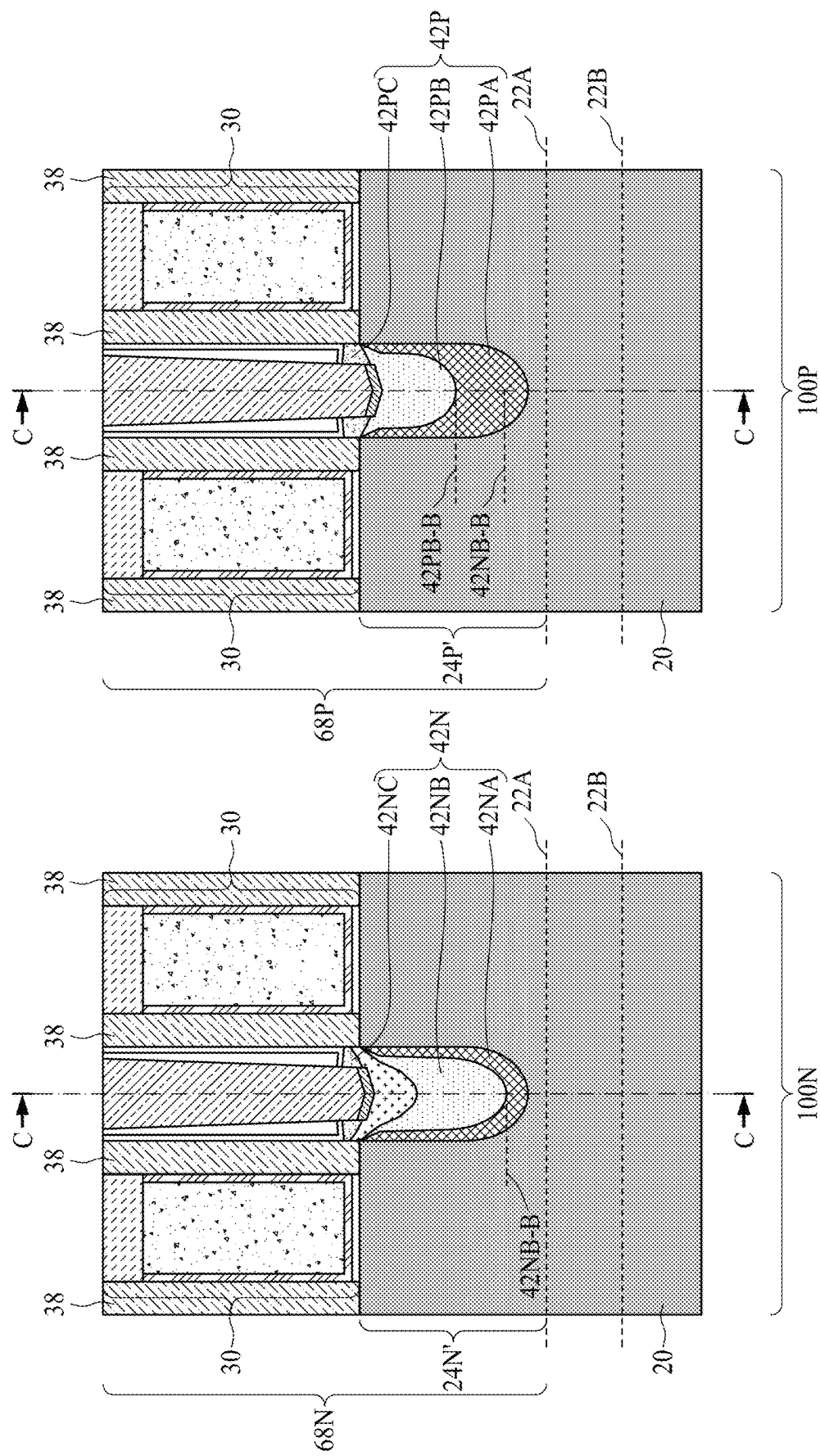
Figure 11C:
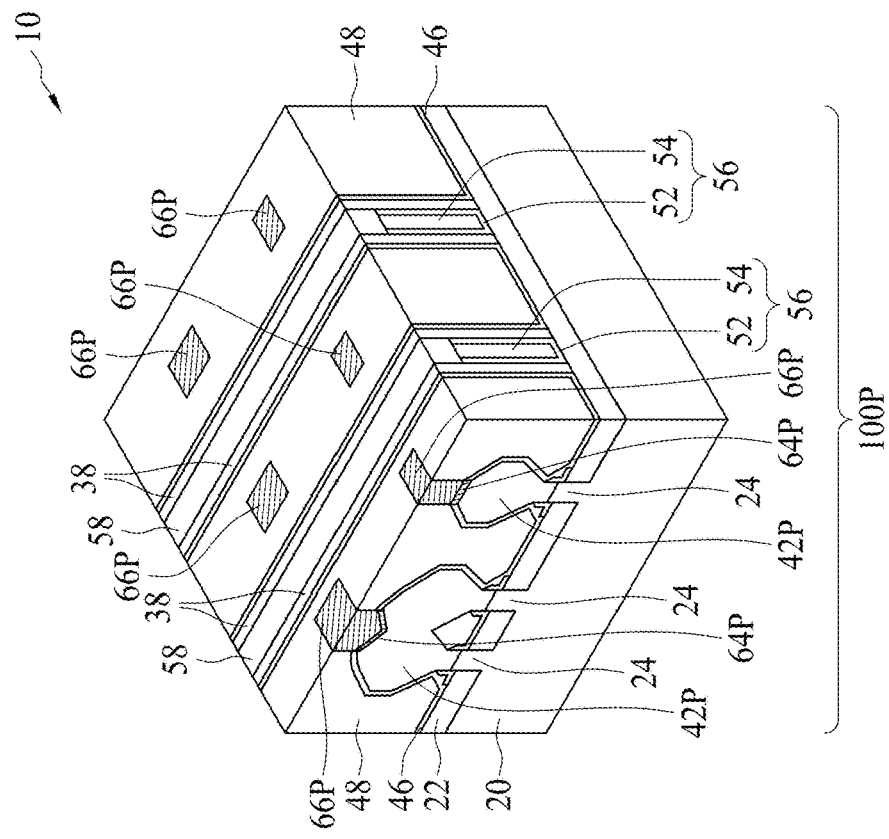
Figure 11C:
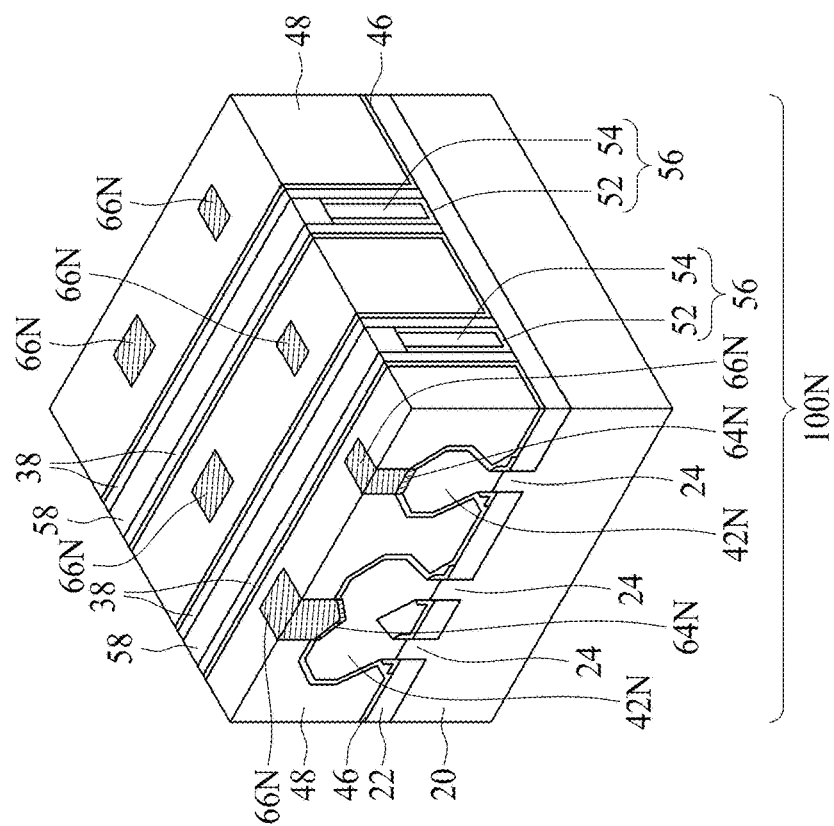
Figure 12:
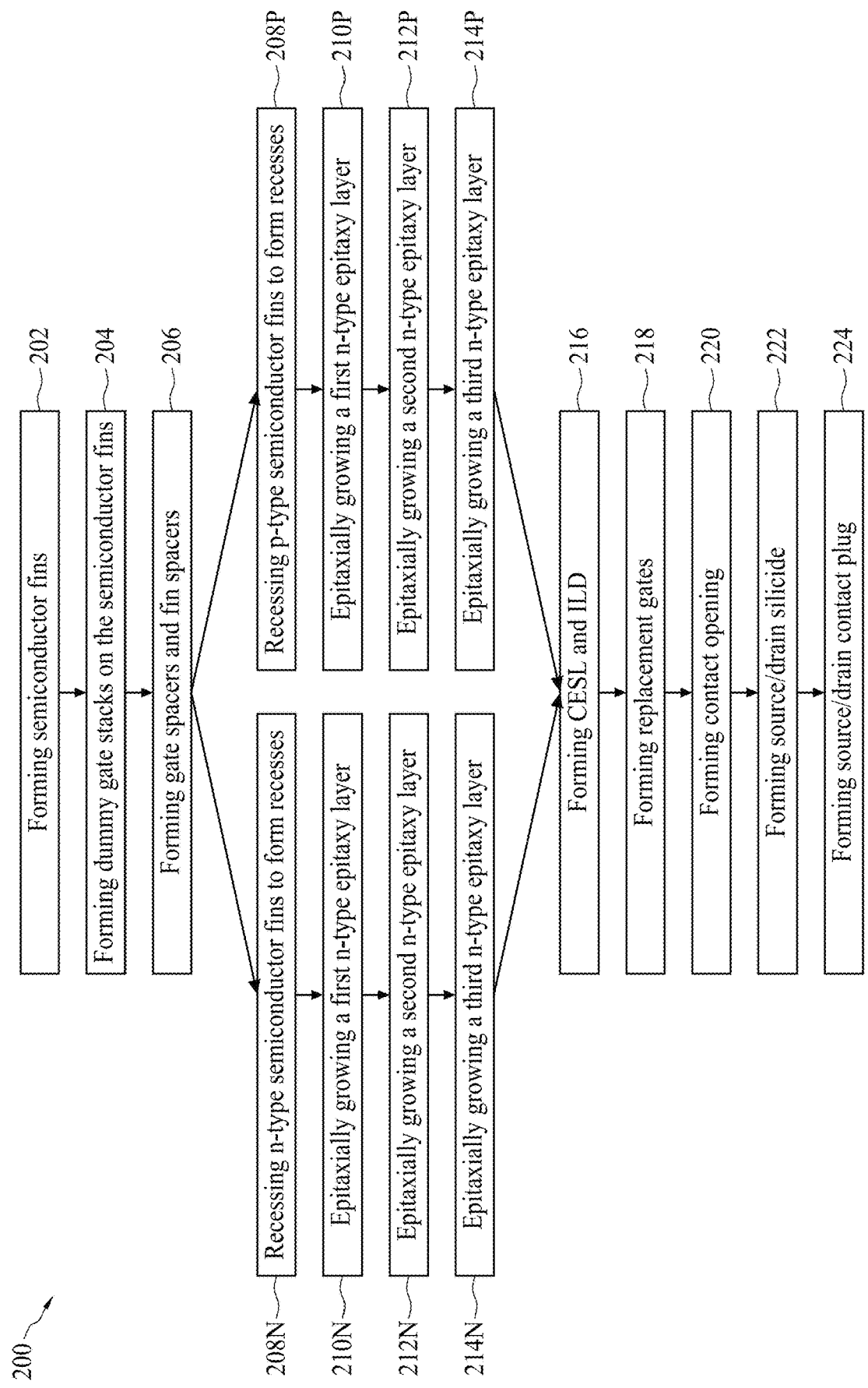
FIG. 12 illustrates a process flow for forming an n-type FinFET and a p-type FinFET in accordance with some embodiments.

In FIG. 3B and subsequent FIG. 4B and FIG. 11B, the level of the top surfaces 22A of STI regions 22 (FIG. 3A) may be illustrated, and semiconductor fin 24' is higher than top surfaces 22A. Bottom surfaces 22B (FIG. 3A) of STI regions 22 are also illustrated in the cross-sectional views. STI regions 22 are locate at the level between 22A and 22B, and are not shown in FIGS. 3B, 4B, and 11B since they are in different planes than illustrated.

FIGS. 4A, 4B, 4C, 5, 6, 7A, and 7B illustrate the processes for forming n-type source/drain regions 42N in n-type device region 100N and p-type source/drain regions 42P in p-type device region 100P. For the easy comparison of n-type source/drain regions 42N and p-type source/drain regions 42P, the corresponding processes for forming each of the layers in n-type source/drain regions 42N and p-type source/drain regions 42P are illustrated in the same figures. This however, does not mean the corresponding layers in n-type source/drain regions 42N and p-type source/drain regions 42P are formed in common processes. Rather, n-type source/drain regions 42N and p-type source/drain regions 42P are formed in separate processes. In accordance with some embodiments, n-type source/drain regions 42N are formed first, followed by the formation of p-type source/drain regions 42P, which means the processes shown in the n-type device region 100N in FIGS. 4A, 4B, 4C, 5, 6, 7A, and 7B are performed first, followed by the processes shown in the p-type device region 100P in FIGS. 4A, 4B, 4C, 5, 6, 7A, and 7B. In accordance with alternative embodiments, p-type source/drain regions 42P is formed first, followed by the formation of n-type source/drain region 42N.

Figure 4C:
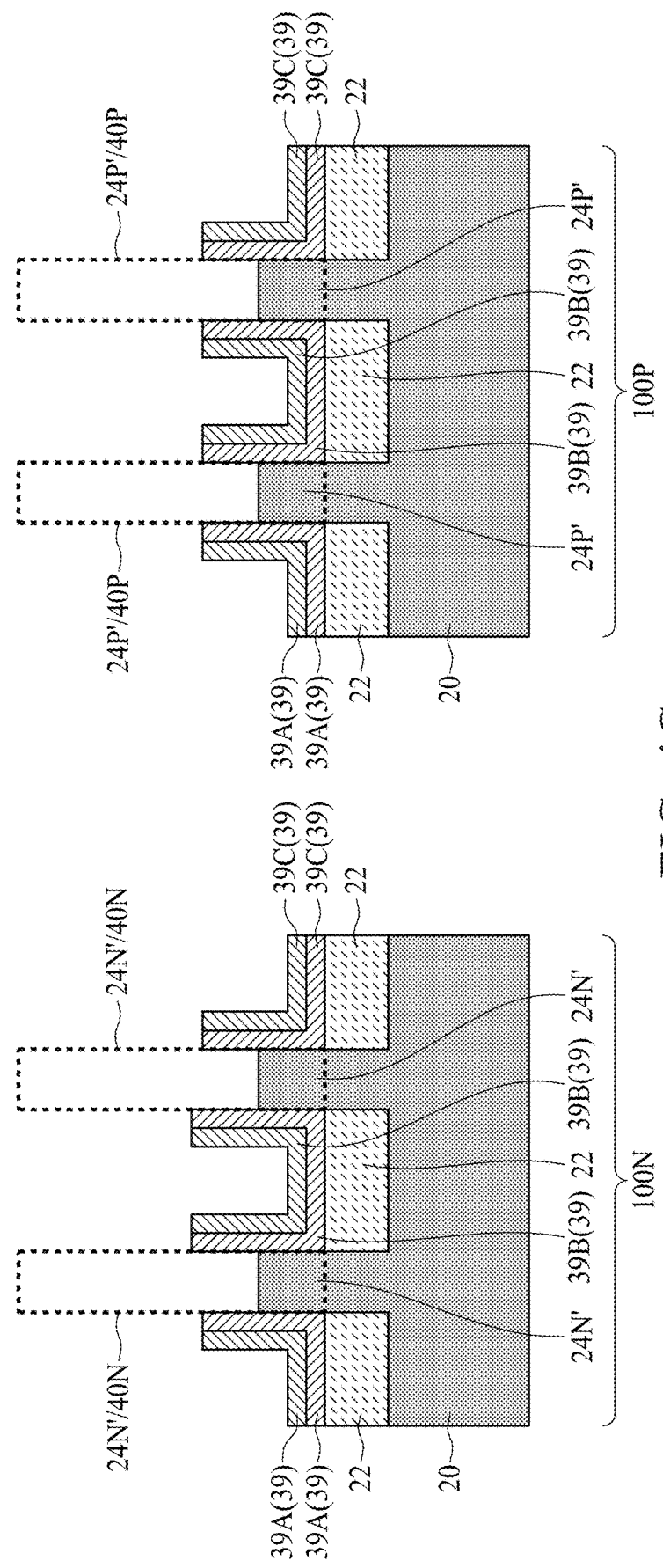

Referring to FIGS. 4A, 4B, and 4C, etching processes (also referred to as a source/drain recessing process hereinafter) are performed to recess the portions of protruding fins 24N' and 24P' that are not covered by dummy gate stacks 30 and gate spacers 38. Recesses 40N and 40P are thus formed. The respective processes are illustrated as process 208N and 208P in the process flow shown in FIG. 12. FIGS. 4B and 4C illustrate the cross-sectional views obtained from reference cross-sections B-B and C-C, respectively, in FIG. 4A. The dashed lines in FIG. 4C illustrate the portions of protruding fins 24N' and 24P' directly underlying gate spacers 38 and gate stacks 30, and are shown as dashed since they are not in the illustrated plane. Also, the dashed lines also illustrate the recesses 40N and 40P. The recessing may be anisotropic, and hence the portions of fins 24N' and 24P' directly underlying dummy gate stacks 30 and gate spacers 38 are protected, and are not etched. Recesses 40N and 40P are also located on opposite sides of dummy gate stacks 30, as shown in FIG. 4A. It is appreciated that although shown in same Figures, recesses 40N may be formed in a separate process from the formation of recesses 40P, as shown in the process flow shown in FIG. 12.

In accordance with some embodiments of the present disclosure, the recessing processes are performed through dry etching processes. The dry etching processes may be performed using process gases such as $C_2F_6$, $CF_4$, $SO_2$, the mixture of HBr, $Cl_2$, and $O_2$, the mixture of HBr, $Cl_2$, $O_2$, and $CF_2$ etc., or the like. The etching may be anisotropic. In accordance with some embodiments of the present disclosure, as shown in FIG. 4B, the sidewalls of protruding fins 24N' and 24P' facing the corresponding recesses 40N and 40P are substantially vertical, and are substantially flushed with the outer sidewalls of the corresponding gate spacers 38. The sidewalls of protruding fins 24N' and 24P' facing recesses 40N and 40P may be on (110) surface planes. In accordance with some embodiments, the bottoms of recesses 40N and 40P are higher than the top surfaces 22A of STI regions 22. In accordance with alternative embodiments, the bottoms of recesses 40N and 40P may be level with or lower than the top surfaces 22A of STI regions 22.

In accordance with some embodiments, during the etching of protruding fins 24', fin spacers 39 are also etched, so that the heights of the outer spacer 39A and inner spacer 39B are reduced. Protruding fins 24N' and 24P' may be recessed more than fin spacers 39.

Figure 5:
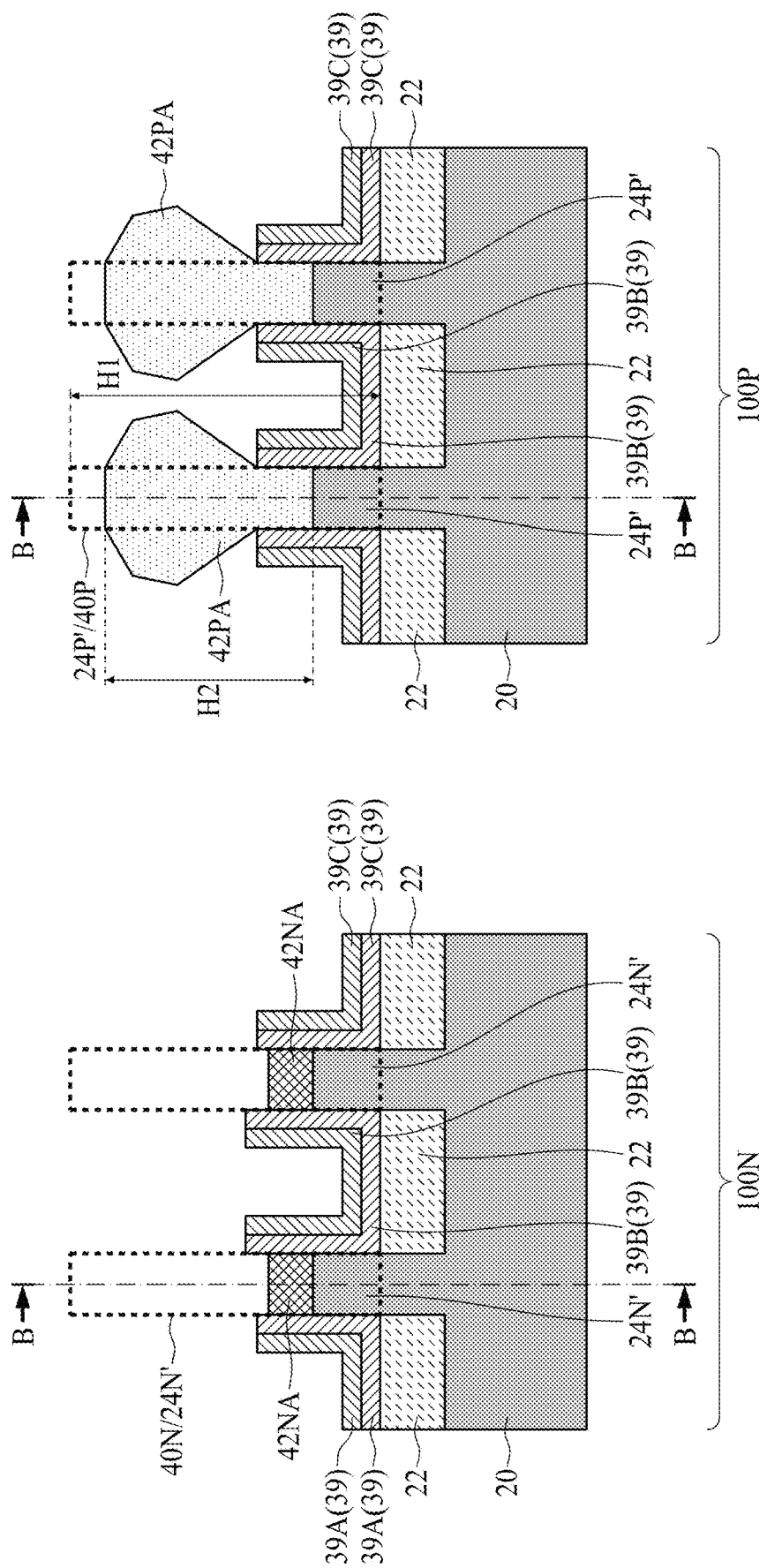
Figure 6:
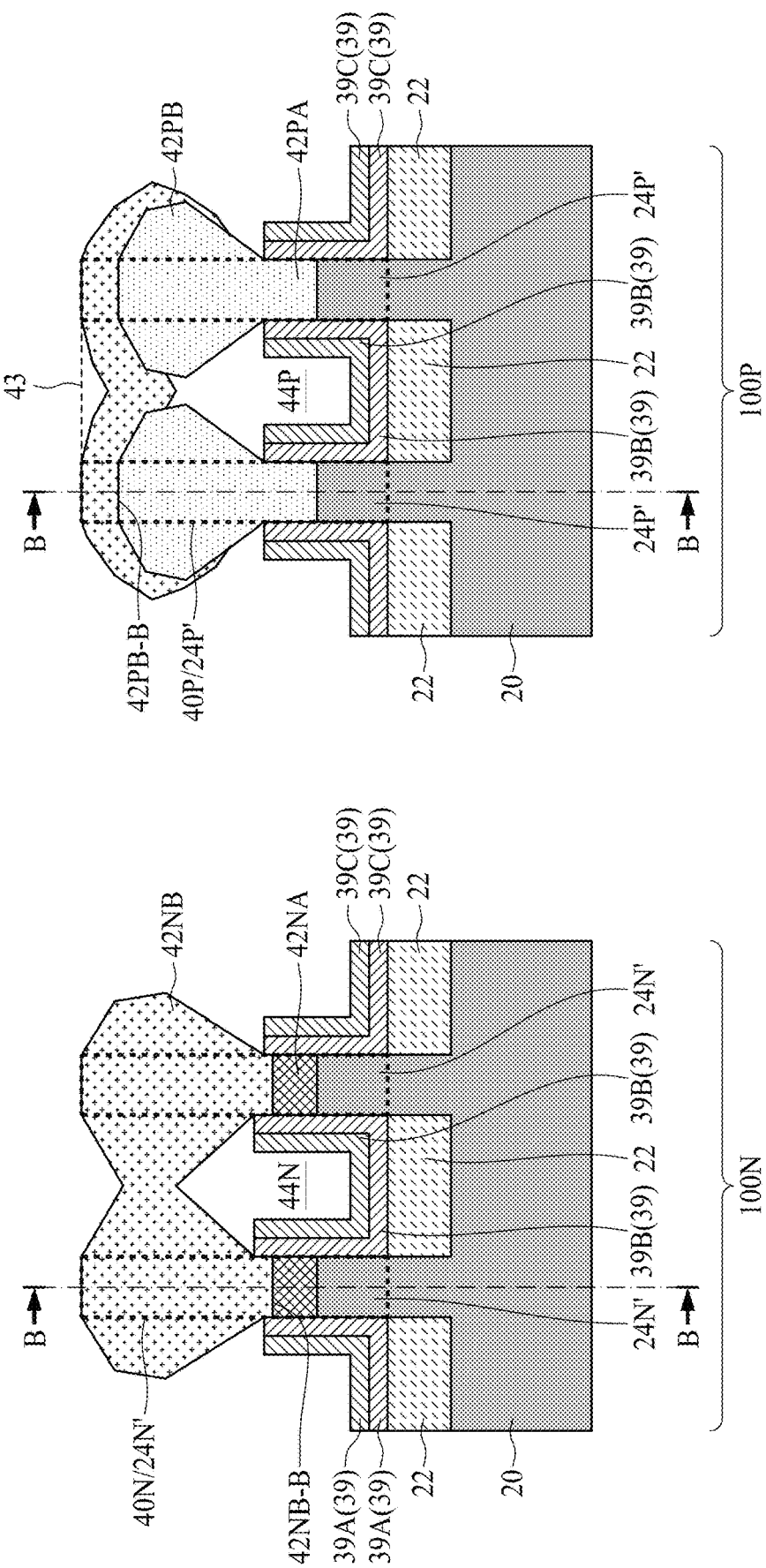
Figure 7A:
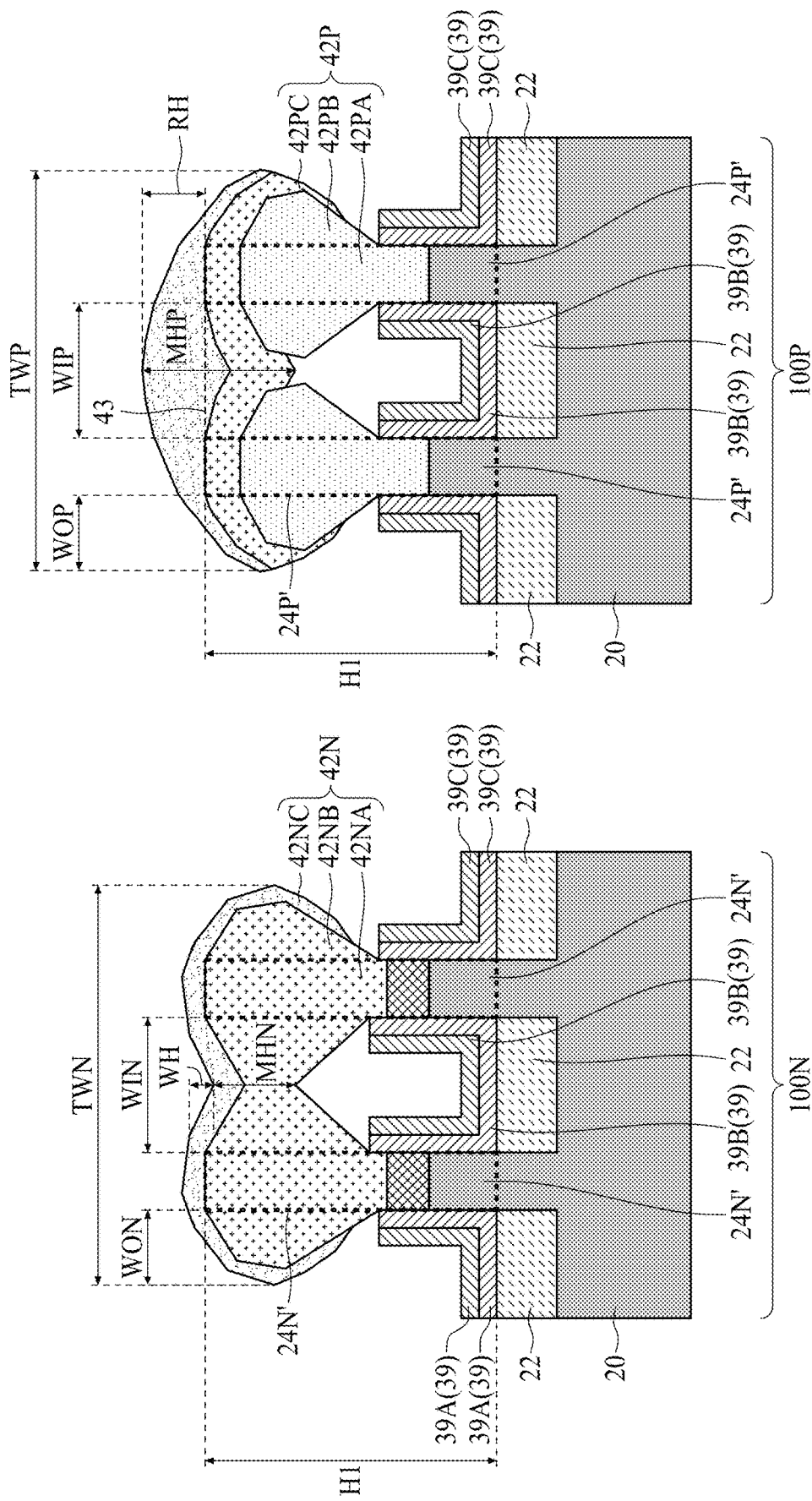

FIGS. 5, 6, and 7A illustrate the processes for depositing the (sub) layers in epitaxy region(s) 42. Again, the layers in n-type FinFET region 100N and p-type FinFET region 100P, although may be shown in the same figures, are actually formed in separate processes. For example, layers 42NA and 42PA are formed by separate deposition processes, layers 42NB and 42PB are formed by separate deposition processes, and layers 42NC and 42PC are formed by separate deposition processes, as shown in the process flow in FIG. 12.

Referring to FIG. 5, epitaxy layers 42NA (which are also referred to as epitaxy layers L1) are deposited in n-type FinFET region 100N through an epitaxy process. The respective process is illustrated as process 210N in the process flow shown in FIG. 12. The cross-sectional view shape of epitaxy layers 42NA in reference cross-section B-B may also be found in FIG. 11B. In accordance with some embodiments, the deposition is performed through a non-conformal deposition process, so that the bottom portion of first layer 42NA is thicker than the sidewall portions. This is incurred by allowing the growth on the (100) surface of semiconductor to be faster than on the (110) surface.

The deposition of epitaxy layer 42NA may be performed using Reduced Pressure Chemical Vapor Deposition (RPCVD), Plasma Enhanced Chemical Vapor Deposition (PECVD), or the like. In the discussion of epitaxy layers 42NA, 42NB, and 42NC (FIGS. 11A and 11B), phosphorous is discussed as an example of the n-type dopants, while other n-type dopant such as arsenic, antimony, or the like, or combinations thereof, may be used. Also, in the discussion of epitaxy layers 42PA, 42PB, and 42PC (FIGS. 11A and 11B), boron is discussed as an example of the p-type dopants, while other p-type dopant such as indium may be used.

In accordance with some embodiments, epitaxy layer 42NA is formed of or comprises SiP. In accordance with alternative embodiments, epitaxy layer 42NA is formed of or comprises SiAs. In accordance with yet alternative embodiments, epitaxy layer 42NA is formed of or comprises a SiAs layer and a SiP layer over the SiAs layer. The process gas for depositing epitaxy layer 42NA may include a silicon-containing gas such as silane, dicholorosilane (DCS), or the like, and a dopant-containing process gas such as $PH_3$, $AsH_3$, or the like, depending on the desirable composition of epitaxy layer 42NA. Epitaxy layer 42NA may have a first doping concentration (such as P or As) in the range between about $1 \times 10^{20}/cm^3$ and about $8 \times 10^{20}/cm^3$. In the deposition process, an etching gas such as HCl is added into the process gases to achieve selective deposition on semiconductor, but not on dielectric. Carrier gas(es) such as $H_2$ and/or $N_2$ may also be included in the process gas, for example, with a flow rate in the range between about 50 sccm and about 500 sccm.

Further referring to FIG. 5, epitaxy layers 42PA (which are also referred to as epitaxy layers L1) are deposited in p-type FinFET region 100P through an epitaxy process. The respective process is illustrated as process 210P in the process flow shown in FIG. 12. In accordance with some embodiments, the deposition is also performed through a non-conformal deposition process, so that the bottom portion of first layer 42PA is thicker than the sidewall portions. The deposition may be performed using RPCVD, PECVD, or the like. In accordance with some embodiments, epitaxy layer 42PA is formed of or comprises SiGeB. The process gas for depositing epitaxy layer 42PA may include a silicon-containing gas such as silane, disilane ($Si_2H_6$) dicholorosilane (DCS), or the like, a germanium-containing gas such as germane ($GeH_4$), digermane ($Ge_2H_6$), or the like, and a dopant-containing process gas such as $B_2H_6$ or the like, depending on the desirable composition of epitaxy layer 42PA. Epitaxy layer 42PA may have a boron concentration in the range between about $1 \times 10^{20}/cm^3$ and about $6 \times 10^{20}/cm^3$. The germanium atomic percentage may be in the range between about 15 percent and about 40 percent.

In accordance with some embodiments, as shown in FIG. 5, the top surfaces of epitaxy layers 42NA are lower than the top ends of fin spacers 39. On the other hand, epitaxy layers 42PA are grown much larger than epitaxy layers 42NA, and the top surfaces of epitaxy layers 42PA are higher than the top ends of fin spacers 39. Accordingly, epitaxy layers 42PA laterally expand to form facets. In accordance with some embodiments, in the cross-sectional view as shown in FIG. 5, the height H2 of the portion of epitaxy layers 42PA is greater than 50 percent, and may be greater than about 70 percent, the height H1 of protruding fins 24'P.

Next, referring to FIG. 6, epitaxy layer 42NB (which is also referred to as epitaxy layer L2) is deposited. The respective process is illustrated as process 212N in the process flow shown in FIG. 12. The deposition process may be performed using RPCVD, PECVD, or the like. In accordance with some embodiments, epitaxy layer 42NB includes silicon phosphorous, with the phosphorous having a second phosphorous concentration higher than the first phosphorous concentration in epitaxy regions 42NA. For example, the second phosphorous concentration in epitaxy regions 42NB may be in the range between about $8\times10^{20}/cm^3$ and about $5\times10^{21}/cm^3$ in accordance with some embodiments. The process gas for forming epitaxy layer 42NB may be similar to the process gas in the formation of epitaxy layer 42NA, except the flow rates of the process gases may be different from the flow rates of the corresponding process gases in the formation of epitaxy layer 42NA.

As shown in FIG. 6, the top ends of epitaxy layer 42NB are level with the top end of protruding fins 24N'. FIG. 11B illustrates the cross-sectional views of the reference cross-sections B-B in FIG. 6, which shows that the opposite ends of epitaxy layer 42NB are level with the top surfaces of protruding fins 24N', while the middle portion of the top surface of epitaxy layer 42NB may be lower than the top surfaces of protruding fins 24N'. The bottom end 42NB-B of epitaxy layer 42NB is also lower than bottom end 42PB-B of epitaxy layer 42PB, which is also shown in FIG. 11B.

The epitaxy layer 42NB grown from neighboring recesses are merged, with air gap 44N being sealed under epitaxy layer 42NB. The top surface of the merged epitaxy layer 42NB may have a non-planar profile (also referred to as having a wavy shape), with the middle portion between neighboring semiconductor fins 24N' being lower than the portions on its opposite sides.

Further referring to FIG. 6, epitaxy layer 42PB (which is also referred to as epitaxy layer L2) is deposited. The respective process is illustrated as process 212P in the process flow shown in FIG. 12. The deposition process may be performed using RPCVD, PECVD, or the like. In accordance with some embodiments, epitaxy layer 42PB includes SiGeB, with the boron having a second boron concentration higher than the boron concentration in epitaxy layer 42PA. For example, the boron concentration in epitaxy layer 42PB may be in the range between about $6\times10^{20}/cm^3$ and about $3\times10^{21}/cm^3$ in accordance with some embodiments. Furthermore, the germanium atomic percentage in epitaxy layer 42PB is higher than the germanium atomic percentage in epitaxy layers 42PA. For example, the germanium atomic percentage in epitaxy layer 42PB may be in the range between about 40 percent and about 60 percent in accordance with some embodiments. The process gas for forming epitaxy layer 42PB may be similar to the process gas in the formation of epitaxy layer 42PA, except the flow rates of the process gases may be different from the flow rates of the corresponding process gases in the formation of epitaxy layer 42PA.

The top end of epitaxy layer 42PB is level with the top end of protruding fins 24P'. FIG. 11B illustrates the cross-sectional views of the reference cross-sections B-B in FIG. 6, which shows that the opposite ends of epitaxy layer 42PB are level with the top surfaces of protruding fins 24P', while the middle portion of the top surface of epitaxy layer 42PB may be lower than the top surfaces of protruding fins 24N'.

The epitaxy layer 42PB grown from neighboring recesses are merged, with air gap 44P being sealed under epitaxy layer 42PB. The top surface of the merged epitaxy layer 42PB may have a non-planar profile (also referred to as having a wavy shape), with the middle portion between neighboring fins 24P' (and the corresponding recesses 40P) being lower than the portions on its opposite sides. In accordance with alternative embodiments, the top surface of the merged epitaxy layer 42PB may have a planar profile (also referred to as having a non-wavy shape), and the corresponding planar top surface is demonstrated by dashed line 43.

FIG. 7A illustrates the epitaxy process for depositing epitaxy layer 42NC (which is also referred to as epitaxy layer L3 or a capping layer). The respective process is illustrated as process 214N in the process flow shown in FIG. 12. The deposition process may be performed using RPCVD, PECVD, or the like. In accordance with some embodiments, epitaxy layer 42NC includes silicon phosphorous. In addition, germanium may be incorporated, for example, with a germanium atomic percentage in the range between about 1 percent and about 5 percent. In accordance with some embodiments, the phosphorous concentration in epitaxy regions 42NC may be in the range between about $1\times10^{21}/cm^3$ and about $3\times10^{21}/cm^3$. The process gas for forming epitaxy layer 42NC may be similar to the process gas in the formation of epitaxy layer 42NB, except a germanium-containing gas such as germane, digermane, or the like may be added. Throughout the description, epitaxy layers 42NA, 42NB, and 42NC are collectively and individually referred to as epitaxy layers or epitaxy regions 42N, which are collectively referred to as source/drain regions 42N hereinafter.

Figure 7B:
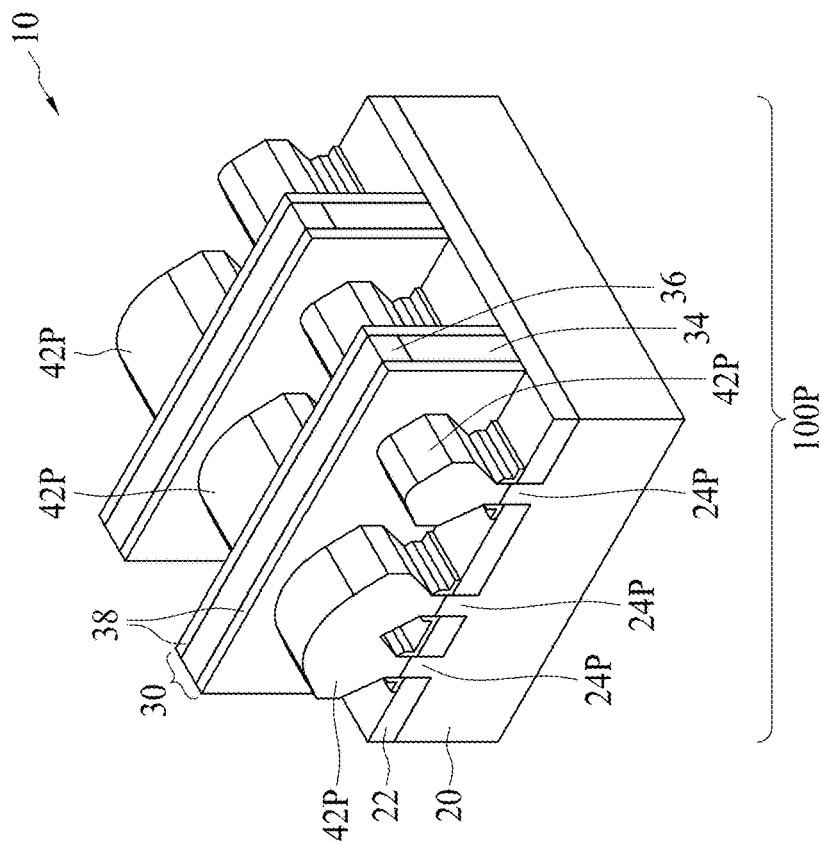
Figure 7B:
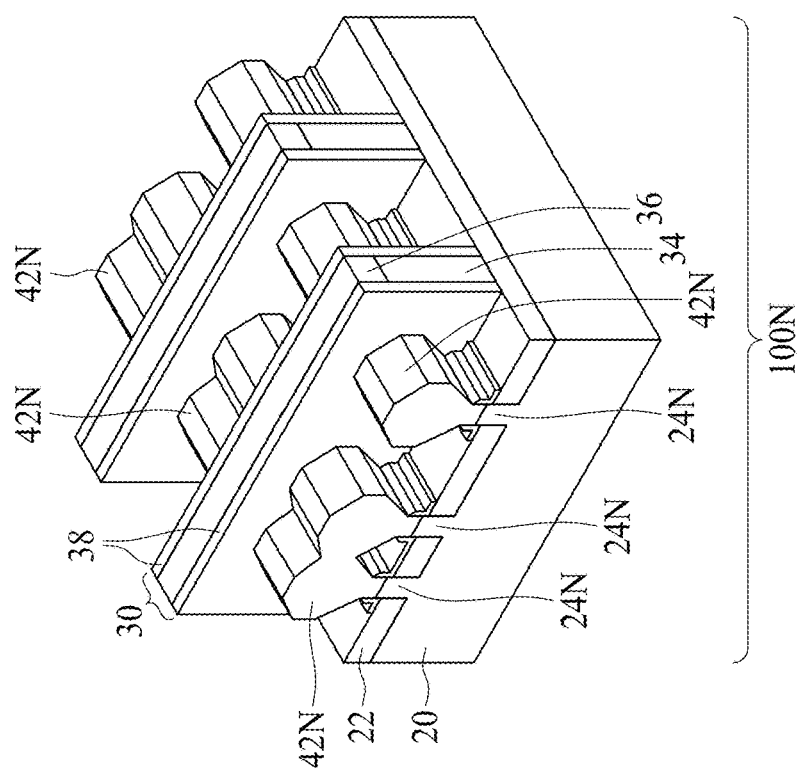

FIG. 7A further illustrates the epitaxy process for depositing epitaxy layer 42PC (which is also referred to as epitaxy layer L3 or a capping layer). The respective process is illustrated as process 214P in the process flow shown in FIG. 12. The deposition process may be performed using RPCVD, PECVD, or the like. The top surface of epitaxy layer 42PC has a non-wavy shape, with a middle portion of the top surface being the highest, and the opposite portions of the top surface being increasingly lower. In accordance with some embodiments, epitaxy layer 42PC includes SiGeB. In accordance with some embodiments, the boron concentration in epitaxy regions 42PC may be in the range between about $8\times10^{20}/cm^3$ and about $1\times10^{21}/cm^3$. Furthermore, the germanium atomic percentage in epitaxy layer 42PC is lower than the germanium atomic percentage in epitaxy layers 42PB. For example, the germanium atomic percentage in epitaxy layers 42PC may be in the range between about 45 percent and about 55 percent in accordance with some embodiments. Throughout the description, epitaxy layers 42PA, 42PB, and 42PC are collectively and individually referred to as epitaxy layers (regions) 42P, which are collectively referred to as source/drain region 42P hereinafter. FIG. 7B illustrates perspective views of source/drain regions 42N and 42P.

As shown in FIG. 7A, the top surface of epitaxy layer 42NC maintains the wavy shape, with the middle portion of the top surface of the epitaxy layer 42NC being lower than opposing portions. The top surface of epitaxy layer 42NC may include a V-shaped portion. On the other hand, epitaxy layer 42PC is grown thicker, and the top surface of epitaxy layer 42PC has a non-wavy shape. Overall, source/drain region 42P has a cone-shaped cross-sectional view in the cross-section shown in FIG. 7A. Forming epitaxy layer 42NC as having a wavy top surface and epitaxy layer 42PC as having a non-wavy (for example, cone shape) has some advantageous features. The wavy shape of epitaxy layer 42NC results in the increase in the contact area between source/drain contact plug (66N in FIG. 11A) and source/drain region 42, and hence the reduction of contact resistance. On the other hand, if source/drain region 42P is formed as having the wavy shape, there will be severe outward bending of protruding fins 24P'. Experiment results have revealed that the bending may be reduced by increasing the raising height RH of source/drain region 42P (and hence resulting in the cone shape). Accordingly, source/drain region 42P is formed as non-wavy. On the other hand, fin bending is not an issue for n-type FinFETs, so source/drain region 42N may be formed as having wavy shapes.

In accordance with some embodiments, for the n-type source/drain region 42, the wavy height WH may be in the range between about 3 nm and about 15 nm in accordance with some embodiments. The merge height MHN may be in the range between about 7 nm and about 20 nm, and may be smaller than about 50 percent of height H1 of protruding fins 24N', wherein height H1 may be in the range between about 40 nm and about 100 nm. The ratio WH/(WH+MHN) may be in the range between about 0.1 and about 0.4. The outer width WON of epitaxy region 42N, which outer width WON is measured on the outer side of protruding fins 24N', is smaller than a half of the inner width WIN, which inner width WIN is the width of epitaxy region 42N between protruding fins 24N'. In accordance with some embodiments, outer width WON is in the range between about 5 nm and about 15 nm, and half inner width WIN/2 is in the range between about 10 nm and about 30 nm. Having outer width WON being smaller than half inner width WIN/2 helps the formation of wavy shape. The total width TWN of epitaxy region 42N (based on two fins) may be in the range between about 40 nm and about 80 nm.

For the p-type source/drain region 42P, the raise height RH (which is the height difference between the topmost point of source/drain region 42P and the top surface level of protruding fins 24P') is controlled to be in a certain range. When raise height RH is too small, in the subsequent formation of contact opening (FIG. 10), epitaxy layers 42PC and 42PB may both be etched-through, and contact plug may land on epitaxy layer 42PA, and may cause series boron loss issue. When raise height RH is too large, epitaxy layer 42PC may not be etched-through, and the contact will land on epitaxy layer 42PC, which has lower dopant concentration than epitaxy layer 42PB. Also, the contact area will not be concaved, and the benefit of reducing contact area will not be achieved. In accordance with some embodiments, raise height RH is in the range between about 5 nm and about 15 nm. The merge height MHP may be in the range between about 40 nm and about 80 nm, and may be greater than about 50 percent of height H1 of protruding fins 24P', wherein height H1 may be in the range between about 40 nm and about 100 nm. The ratio RH/MHP may be in the range between about 0.1 and about 0.4. The outer width WOP of epitaxy region 42P, which outer width WOP is on the outer side of protruding fins 24P', is greater than WIP/2, wherein inner width WIP is the width of the part of epitaxy region 42P between protruding fins 24P'. In accordance with some embodiments, outer width WOP is in the range between about 15 nm and about 30 nm, and inner width WI1 is in the range between about 20 nm and about 40 nm. The total width TWP of epitaxy region 42P may be in the range between about 40 nm and about 80 nm. Ratio MHN/MHP may be in the range between about 0.15 and about 0.6.

Figure 8A:
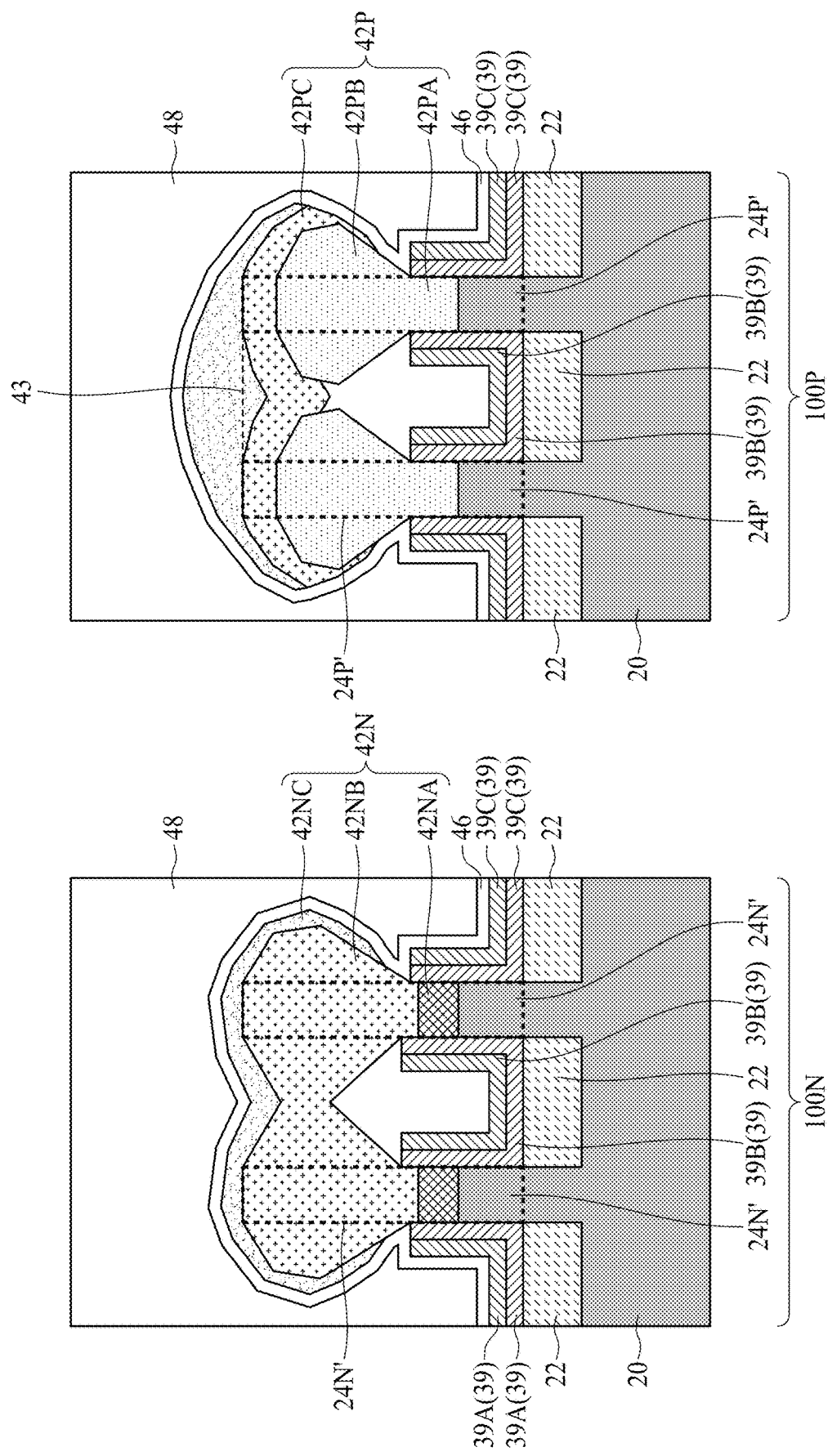
Figure 8B:
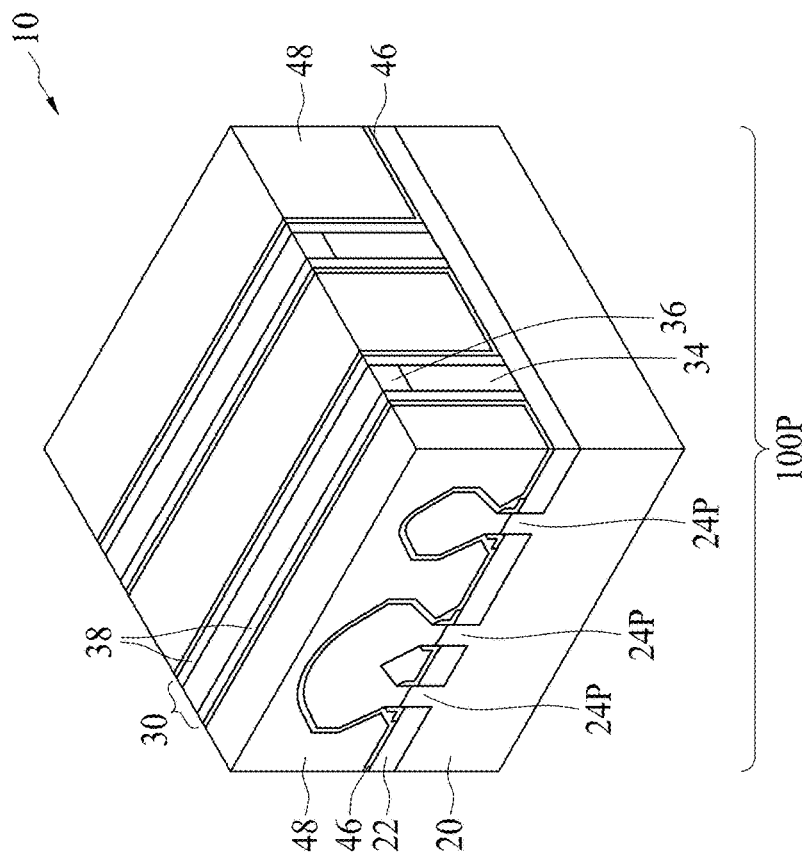
Figure 8B:
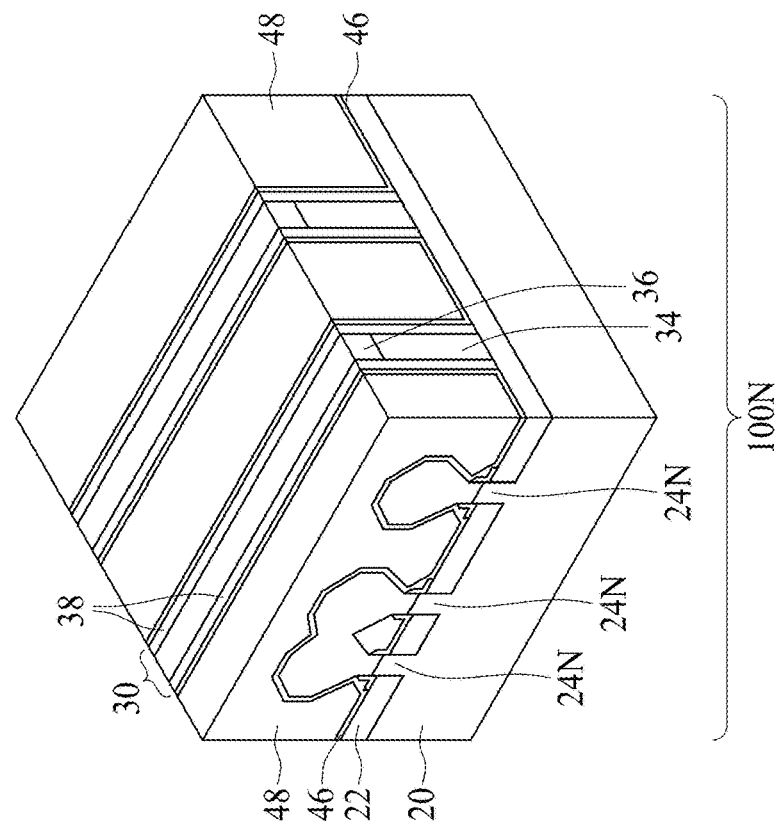

Referring to FIGS. 8A and 8B, Contact etch stop layer (CESL) 46 and Inter-Layer Dielectric (ILD) 48 are formed over epitaxy regions 42P and 42N, and over dummy gate stacks 30 (FIG. 8B). The respective process is illustrated as process 216 in the process flow shown in FIG. 12. A planarization such as Chemical Mechanical Polish (CMP) process or a mechanical grinding process is performed to remove excess portions of CESL 46 and ILD 48, until dummy gate stacks 30 (FIG. 8B) are exposed.

Figure 9:
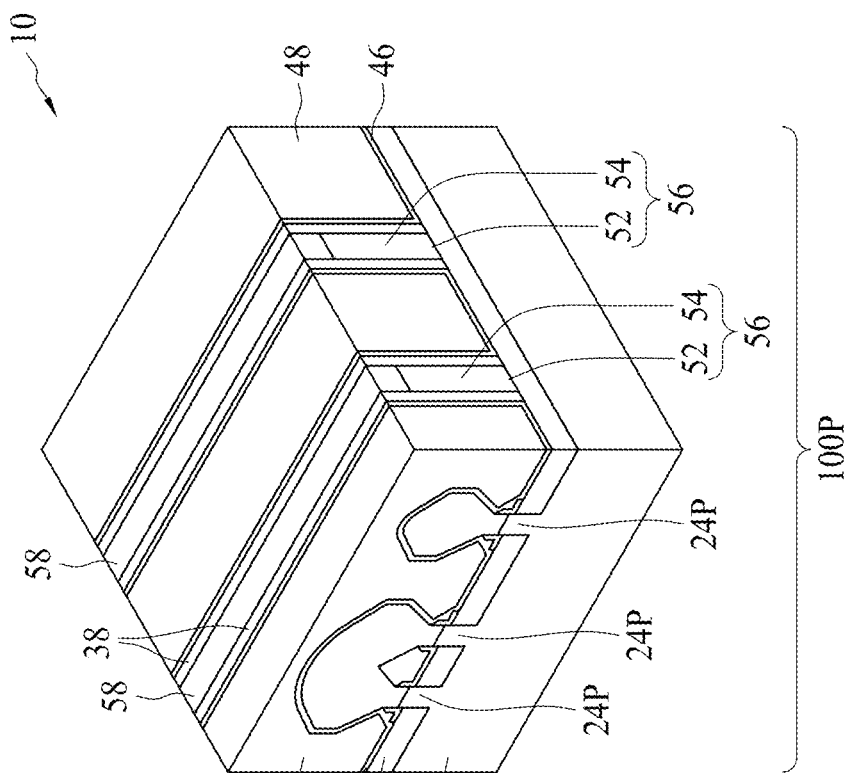
Figure 9:
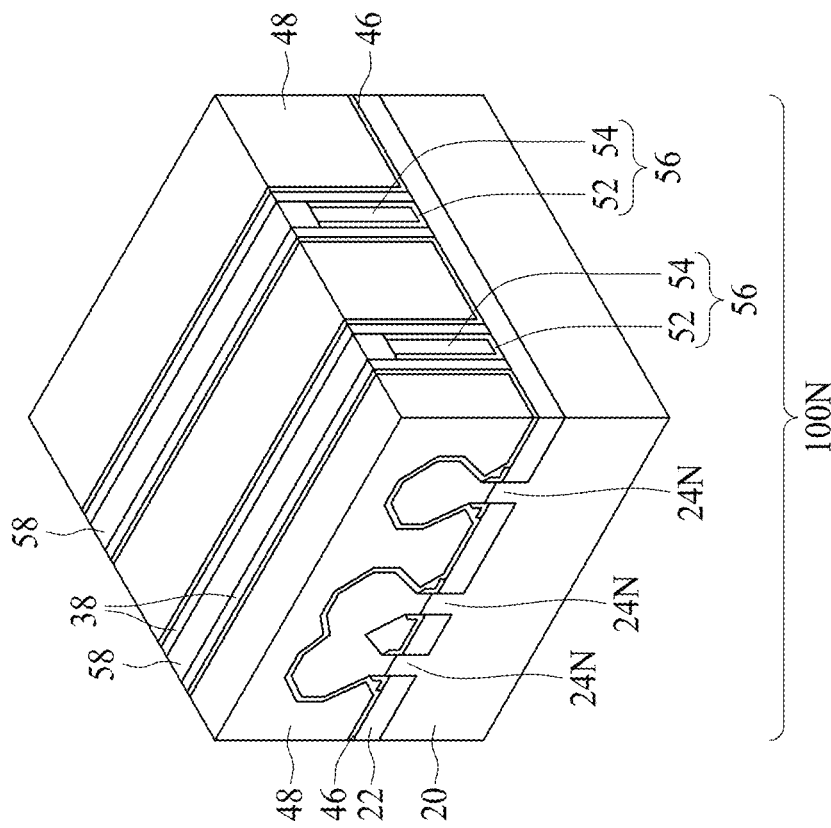

Referring to FIG. 9, the dummy gate stacks 30 are replaced with replacement gate stacks 56. The respective process is illustrated as process 218 in the process flow shown in FIG. 12. Replacement gate stacks 56 include gate dielectrics 52, which further include interfacial layers on the top surfaces and sidewalls of protruding fins 24', and high-k dielectrics on the interfacial layers. Replacement gate stacks 56 further include gate electrodes 54 over high-k dielectrics 52. After the formation of replacement gate stacks 56, replacement gate stacks 56 are recessed to form trenches between gate spacers 38. A dielectric material such as silicon nitride, silicon oxynitride, or the like, is filled into the resulting trenches to form hard masks 58.

Figure 10:
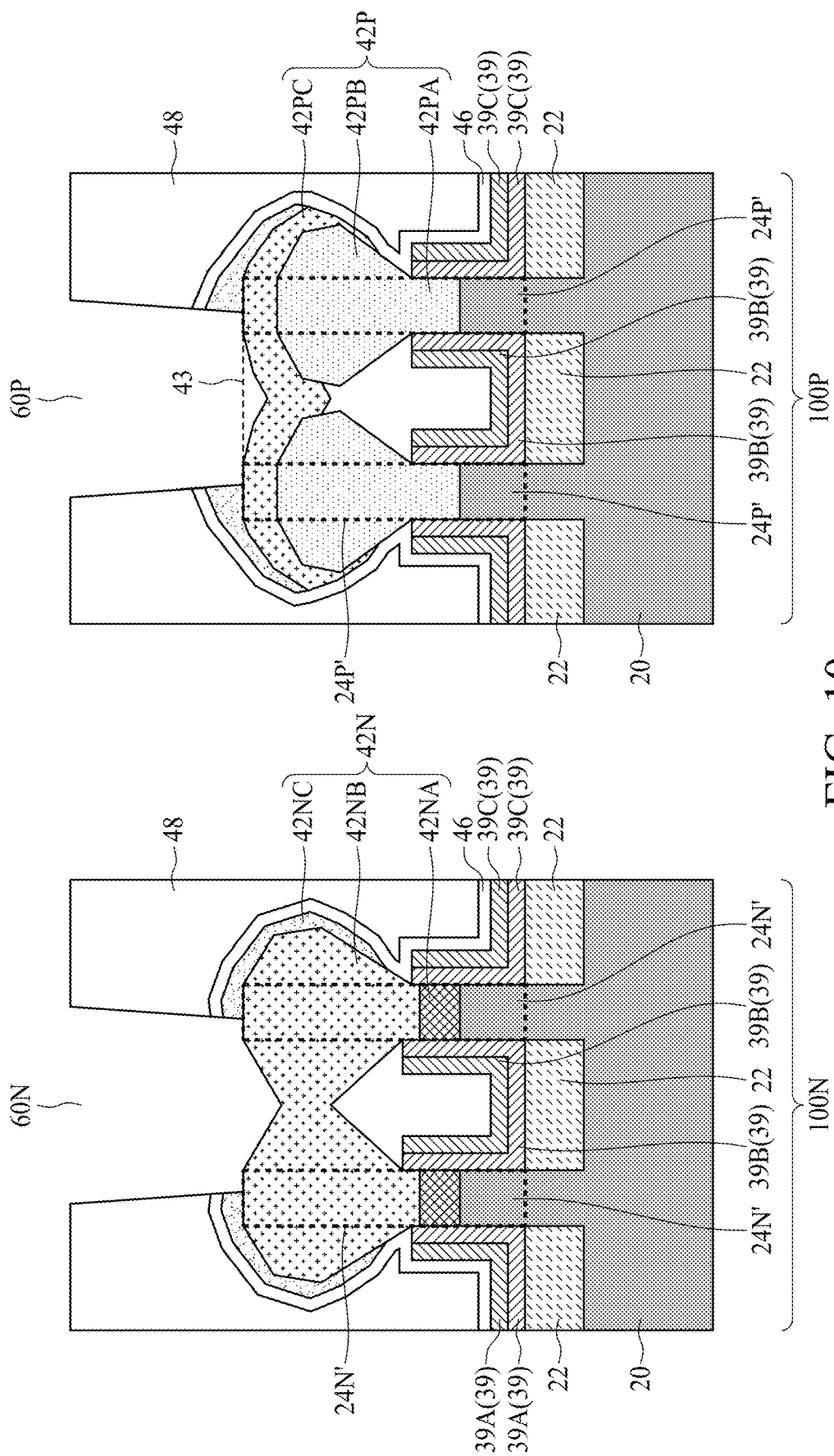

Next, referring to FIG. 10, ILD 48 and CESL 46 are etched to form contact openings 60N and 60P simultaneously, so that epitaxy layers 42NB and 42PB, respectively, are exposed. The respective process is illustrated as process 220 in the process flow shown in FIG. 12. Epitaxy layer 42NC is etched-through, and the top surface of epitaxy layer 42NB is exposed. The adding of germanium in epitaxy layer 42NC results in the etching rate of epitaxy layer 42NC to be significantly greater than the etching rate of epitaxy layer 42NB, and hence by controlling the etching process, the etching may substantially stopped on epitaxy layer 42NB, with the over-etching of epitaxy layer 42NB being small. The exposed top surface of epitaxy layer 42NB is wavy, with the middle portion being recessed lower than the opposing portions on the opposite sides of the middle portion, so that the exposed top surface of epitaxy layer 42NB has a V-shape in the cross-sectional view.

In the p-type device region 100P, although source/drain region 42 has a cone shape, and epitaxy layer 42PC is thicker than epitaxy layer 42NC, the etching rate of epitaxy layer 42PC, however, is higher (for example, two times higher) than epitaxy layer 42NC. This compensates for the greater thickness of epitaxy layer 42PC, so that when epitaxy layer 42NC is etched-through, epitaxy layer 42PC is also etched-through, and the exposed top surface of epitaxy layer 42PB also has a concave (wavy) shape.

Next, as shown in FIGS. 11A and 11B, source/drain silicide regions 64N and 64P and source/drain contact plugs 66N and 66P are formed. FIG. 11B illustrates the cross-sectional view in reference cross-section B-B in FIG. 11A, and FIG. 11A illustrates the cross-sectional view in reference cross-section C-C in FIG. 11B. The reference cross-sections B-B and C-C are also the same as in FIG. 4A. In accordance with some embodiments of the present disclosure, the formation of the source/drain silicide regions 64N and 64P includes depositing a metal layer such as a titanium layer, a cobalt layer, or the like, extending into both of openings 60N and 60P (FIG. 10), and then performing an annealing process so that the bottom portions of the metal layer react with epitaxy layers 42NB and 42PB to form the silicide regions 64N and 64P, respectively. The respective process is illustrated as process 222 in the process flow shown in FIG. 12. The remaining un-reacted metal layer may be removed. Source/drain contact plugs 66N and 66P are then formed in trenches 60N and 60P, respectively, and are electrically connected to the respective source/drain silicide region 64N and 64P, respectively. The respective process is illustrated as process 224 in the process flow shown in FIG. 12. In accordance with some embodiments, depth DSN of the recess in silicide region 64N, which is also the depth of the concave recess of the top surface of epitaxy layer 42NB, is greater than depth DSP, which is the depth of the recess in silicide region 64N. Depth DSP is also equal to the depth of the concave recess of the top surface of epitaxy layer 42PB. N-type FinFET 68N and p-type FinFET 68P are thus formed. In accordance with alternative embodiments, as demonstrated by the dashed top surface 43 in FIG. 6, depth DSP is equal to 0, which means silicide region 64N, instead of having a recess, is planar.

The embodiments of the present disclosure have some advantageous features. By forming the n-type source/drain regions as having wavy top surfaces, the contact resistance, which is the resistance of the source/drain contact plug and the source/drain regions is reduced since the wavy shape has increased contact area than planar shapes. By forming the p-type source/drain regions as having cone-shapes, the fin bending in the fins of the p-type FinFET is reduced. Furthermore, the contact resistance of the source/drain contact plugs to the p-type source/drain regions is not increased (and actually also reduced) since the contact areas also have the wavy shape. In addition, with the cone shape, the source/drain regions of p-type FinFETs have a boost of strain, and hence a boost of current.

In accordance with some embodiments of the present disclosure, a method comprises forming an n-type FinFET comprising forming a first gate stack on a first semiconductor fin and a second semiconductor fin; etching first portions of the first semiconductor fin and the second semiconductor fin to form a first recess and a second recess, respectively; and performing first epitaxy processes to form an n-type source/drain region, wherein the n-type source/drain region comprises a first portion grown from the first recess and a second portion grown from the second recess, and a first middle portion joined to the first portion and the second portion, wherein the first middle portion has a concave top surface; and forming a p-type FinFET comprising forming a second gate stack on a third semiconductor fin and a fourth semiconductor fin; etching second portions of the third semiconductor fin and the fourth semiconductor fin to form a third recess and a fourth recess, respectively; and performing second epitaxy processes to form a p-type source/drain region, wherein the p-type source/drain region comprises a third portion grown from the third recess and a fourth portion grown from the fourth recess, and a second middle portion joined to the third portion and the fourth portion, wherein the second middle portion has a convex top surface. In an embodiment, the method further comprises forming a first source/drain silicide region on the n-type source/drain region; and forming a second source/drain silicide region on the p-type source/drain region, wherein the first source/drain silicide region and the second source/drain silicide region have a first downward-pointing V-shape and a second downward-pointing V-shape, respectively. In an embodiment, the first downward-pointing V-shape has a greater height than the second downward-pointing V-shape. In an embodiment, the p-type source/drain region comprises a first layer, a second layer over the first layer, and a third layer over the second layer, and wherein the first layer grows laterally to form facets. In an embodiment, the n-type source/drain region comprises a fourth layer, a fifth layer over the fourth layer, and a sixth layer over the fifth layer, wherein portions of the fourth layer grown from the first recess and the second recess are limited in the first recess and the second recess. In an embodiment, the p-type source/drain region comprises SiGeB, and the third layer has a lower germanium atomic percentage than the second layer, and wherein the method further comprises etching-through the third layer to expose the second layer, and the exposed second epitaxy layer has an additional concave top surface. In an embodiment, the p-type source/drain region comprises a p-type capping layer as a top part of the second middle portion, and wherein the p-type capping layer comprises the convex top surface, and a concave bottom surface. In an embodiment, the first epitaxy processes and the second epitaxy processes are performed using remote plasma chemical vapor deposition. In an embodiment, the n-type source/drain region comprises a first outer portion on a first outer side of the first semiconductor fin; and a first inner portion between the first semiconductor fin and the second semiconductor fin, wherein the first outer portion is narrow than a half of the first inner portion. In an embodiment, the p-type source/drain region comprises a second outer portion on a second outer side of the second semiconductor fin; and a second inner portion between the third semiconductor fin and the fourth semiconductor fin, wherein the second outer portion is wider than a half of the second inner portion.

In accordance with some embodiments of the present disclosure, a method comprises forming an n-type FinFET comprising forming an n-type source/drain region comprising depositing a first epitaxy layer, wherein the first epitaxy layer comprises a first portion grown in a first recess in a first semiconductor fin, a second portion grown in a second recess in a second semiconductor fin, and a first middle portion joining the first portion to the second portion; and depositing a first capping layer over the first epitaxy layer, wherein the first capping layer comprises a second middle portion directly over the first middle portion, and the second middle portion has a concave top surface; and forming a p-type FinFET comprising forming a p-type source/drain region comprising depositing a second epitaxy layer, wherein the second epitaxy layer comprises a third portion grown in a third recess in a third semiconductor fin, a fourth portion grown in a fourth recess in a fourth semiconductor fin, and a third middle portion joining the third portion to the fourth portion; and depositing a second capping layer over the second epitaxy layer, wherein the second capping layer comprises a fourth middle portion directly over the third middle portion, and the fourth middle portion has a convex top surface. In an embodiment, the first capping layer and the first epitaxy layer comprise silicon phosphorus, and the first capping layer has a lower phosphorous concentration than the first epitaxy layer. In an embodiment, the second capping layer and the second epitaxy layer comprise silicon germanium boron, and the second capping layer has a lower germanium atomic percentage than the second epitaxy layer. In an embodiment, the method further comprises depositing a contact etch stop layer and an inter-layer dielectric over the n-type source/drain region and the p-type source/drain region; etching the contact etch stop layer, the inter-layer dielectric, and the first capping layer to form a first contact opening, with a first exposed portion of the first epitaxy layer being concave; and etching the contact etch stop layer, the inter-layer dielectric, and the second capping layer to form a second contact opening, with a second exposed portion of the second epitaxy layer also being concave. In an embodiment, the method further comprises, before the depositing the first epitaxy layer, depositing a third epitaxy layer into the first recess and the second recess, wherein the third epitaxy layer has a lower phosphorous concentration that the first epitaxy layer; and before the depositing the second epitaxy layer, depositing a fourth epitaxy layer into the third recess and the fourth recess, wherein the fourth epitaxy layer has a lower germanium atomic percentage than the second epitaxy layer. In an embodiment, the depositing the first capping layer comprises depositing SiGeP.

In accordance with some embodiments of the present disclosure, a method comprises etching a first semiconductor fin and a second semiconductor fin to form a first recess and a second recess, respectively; epitaxially growing an n-type source/drain region comprising a first portion grown from the first recess; a second portion grown from the second recess; and a first middle portion between the first portion and the second portion, wherein the first middle portion has a concave top surface; forming a first contact opening extending into the n-type source/drain region, wherein the first contact opening comprises a first V-shaped bottom; etching a third semiconductor fin and a fourth semiconductor fin to form a third recess and a fourth recess, respectively; forming a p-type source/drain region comprising a third portion grown from the third recess; a fourth portion grown from the fourth recess; and a second middle portion between the third portion and the fourth portion, wherein the second middle portion has a convex top surface; and forming a second contact opening extending into the p-type source/drain region, wherein the second middle portion having the convex top surface is etched, and the second contact opening comprises a second V-shaped bottom, with a tip of the second V-shaped bottom being downwardly pointing. In an embodiment, the etched second middle portion has a middle part thicker than parts on opposing sides of the middle part. In an embodiment, the second middle portion has a highest point higher than top surfaces of the third semiconductor fin and the fourth semiconductor fin. In an embodiment, the first V-shaped bottom has a first height greater than a second height of the second V-shaped bottom.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming an n-type Fin-Field Effect Transistor (FinFET) comprising:
        forming a first gate stack on a first semiconductor fin and a second semiconductor fin;
        etching first portions of the first semiconductor fin and the second semiconductor fin to form a first recess and a second recess, respectively; and
        performing first epitaxy processes to form an n-type source/drain region comprising:
            a first layer comprising a first portion grown from the first recess and a second portion grown from the second recess, and a first middle portion joined to the first portion and the second portion, with a first void being formed under and exposed to the first layer; and
            a second layer over and contacting the first layer and comprising a concave top surface, wherein the second layer is separated from the first void by the first layer, and wherein the concave top surface is viewed from a first vertical plane that is parallel to a first lengthwise direction of the first gate stack;
    forming a p-type FinFET comprising:
        forming a second gate stack on a third semiconductor fin and a fourth semiconductor fin;
        etching second portions of the third semiconductor fin and the fourth semiconductor fin to form a third recess and a fourth recess, respectively; and
        performing second epitaxy processes to form a p-type source/drain region comprising:
            a third layer comprising a third portion grown from the third recess and a fourth portion grown from the fourth recess, wherein the third portion and the fourth portion are spaced apart from each other, with a second void being formed under and exposed to the third layer; and
            a fourth layer over and contacting the third layer, wherein a bottom surface of the fourth layer is exposed to the second void, and the fourth layer comprises a convex top surface.

2. The method of claim 1 further comprising:
    forming a first silicide layer on the n-type source/drain region; and
    forming a second silicide layer on the p-type source/drain region, wherein both of the first silicide layer and the second silicide layer have concave top surfaces.

3. The method of claim 2, wherein the first silicide layer has a first height, and the second silicide layer has a second height smaller than the first height.

4. The method of claim 1, wherein the third layer of the p-type source/drain region grows laterally to form facets.

5. The method of claim 4, wherein the n-type source/drain region further comprises a fifth layer under the first layer, wherein portions of the fifth layer grown from the first recess and the second recess are limited in the first recess and the second recess.

6. The method of claim 4, wherein the p-type source/drain region comprises SiGeB.

7. The method of claim 1, wherein the p-type source/drain region further comprises:
    a second middle portion joined to the third portion and the fourth portion, wherein the second middle portion comprises
    a p-type capping layer as a top part, and wherein the p-type capping layer comprises the convex top surface, and a concave bottom surface.

8. The method of claim 1, wherein the first epitaxy processes and the second epitaxy processes are performed using remote plasma chemical vapor deposition.

9. The method of claim 1, wherein the n-type source/drain region comprises:
    a first outer portion on a first outer side of the first semiconductor fin; and
    a first inner portion between the first semiconductor fin and the second semiconductor fin, wherein the first semiconductor fin and the second semiconductor fin are immediately neighboring each other, wherein the first outer portion is narrow than a half of the first inner portion.

10. The method of claim 9, wherein the p-type source/ drain region comprises:
    a second outer portion on a second outer side of the second semiconductor fin; and
    a second inner portion between the third semiconductor fin and the fourth semiconductor fin, wherein the second outer portion is wider than a half of the second inner portion.

11. A method comprising:
    forming an n-type Fin-Field Effect Transistor (FinFET) comprising:
        forming an n-type source/drain region comprising:

depositing a first epitaxy layer, wherein the first epitaxy layer comprises a first portion grown in a first recess in a first semiconductor fin, a second portion grown in a second recess in a second semiconductor fin, and a first middle portion joining the first portion to the second portion;

depositing a first capping layer over the first epitaxy layer, wherein the first capping layer comprises a second middle portion directly over the first middle portion, and the second middle portion has a concave top surface, and wherein the concave top surface is viewed from a first vertical plane that is perpendicular to a first lengthwise direction of the first semiconductor fin; and forming a first silicide layer on the n-type source/drain region that has the concave top surface, wherein the first silicide layer has a first additional concave shape; and forming a p-type FinFET comprising:
forming a p-type source/drain region comprising:
depositing a second epitaxy layer, wherein the second epitaxy layer comprises a third portion grown in a third recess in a third semiconductor fin, a fourth portion grown in a fourth recess in a fourth semiconductor fin, and a third middle portion joining the third portion to the fourth portion;

depositing a second capping layer over the second epitaxy layer, wherein the second capping layer comprises a fourth middle portion directly over the third middle portion, and the fourth middle portion has a convex top surface, and wherein the convex top surface is viewed from a second vertical plane that is perpendicular to a second lengthwise direction of the third semiconductor fin; and forming a second silicide layer on the p-type source/drain region that has the convex top surface, wherein the second silicide layer has a second additional concave shape.

12. The method of claim 11, wherein the first capping layer and the first epitaxy layer comprise silicon phosphorus, and the first capping layer has a lower phosphorous concentration than the first epitaxy layer.

13. The method of claim 11, wherein the second capping layer and the second epitaxy layer comprise silicon germanium boron, and the second capping layer has a lower germanium atomic percentage than the second epitaxy layer.

14. The method of claim 11 further comprising:
depositing a contact etch stop layer and an inter-layer dielectric over the n-type source/drain region and the p-type source/drain region;
etching the contact etch stop layer, the inter-layer dielectric, and the first capping layer to form a first contact opening, with a first exposed portion of the first epitaxy layer being concave, wherein the first silicide layer is at a bottom of the first contact opening; and
etching the contact etch stop layer, the inter-layer dielectric, and the second capping layer to form a second contact opening, with a second exposed portion of the second epitaxy layer also being concave, wherein the second silicide layer is at a bottom of the second contact opening.

15. The method of claim 11 further comprising:
before the depositing the first epitaxy layer, depositing a third epitaxy layer into the first recess and the second recess, wherein the third epitaxy layer has a lower phosphorous concentration that the first epitaxy layer; and before the depositing the second epitaxy layer, depositing a fourth epitaxy layer into the third recess and the fourth recess, wherein the fourth epitaxy layer has a lower germanium atomic percentage than the second epitaxy layer.

16. The method of claim 11, wherein the depositing the first capping layer comprises depositing SiGeP.

17. A method comprising:
etching a first semiconductor fin and a second semiconductor fin to form a first recess and a second recess, respectively;
epitaxially growing an n-type source/drain region comprising:
a first portion grown from the first recess;
a second portion grown from the second recess; and
a first middle portion between the first portion and the second portion, wherein the first middle portion has a concave top surface, and wherein the concave top surface is viewed from a first vertical plane that is perpendicular to a first lengthwise direction of the first semiconductor fin;
forming a first contact opening extending into the n-type source/drain region, wherein the first contact opening comprises a first V-shaped bottom;
forming a first silicide layer at a bottom of the first contact opening, wherein the first silicide layer is concaved;
etching a third semiconductor fin and a fourth semiconductor fin to form a third recess and a fourth recess, respectively;
forming a p-type source/drain region comprising:
a third portion grown from the third recess;
a fourth portion grown from the fourth recess; and
a second middle portion between the third portion and the fourth portion, wherein the second middle portion has a convex top surface, and wherein the convex top surface comprises a topmost point, and wherein portions of the convex top surface on opposites sides of the topmost point are curved and are increasingly lower in heights;
forming a second contact opening extending into the p-type source/drain region, wherein the second middle portion having the convex top surface is etched, and the second contact opening comprises a second V-shaped bottom, with a tip of the second V-shaped bottom being downwardly pointing; and
forming a second silicide layer at a bottom of the second contact opening, wherein the second silicide layer that is formed by etching the convex top surface of the p-type source/drain region is also concaved.

18. The method of claim 17, wherein the second middle portion comprises:
a middle part and opposite parts on opposing sides of the middle part, wherein the middle part is thicker than the opposite parts.

19. The method of claim 17, wherein before the third semiconductor fin and the fourth semiconductor fin are etched, the third semiconductor fin and the fourth semiconductor fin have top surfaces, and wherein the second middle portion has a highest point higher than the top surfaces of the third semiconductor fin and the fourth semiconductor fin.

20. The method of claim 17, wherein the first V-shaped bottom has a first height greater than a second height of the second V-shaped bottom.

* * * * *